(12) United States Patent
Grise et al.

(10) Patent No.: US 7,840,863 B2
(45) Date of Patent: Nov. 23, 2010

(54) FUNCTIONAL FREQUENCY TESTING OF INTEGRATED CIRCUITS

(75) Inventors: Gary D. Grise, Colchester, VT (US); Steven F. Oakland, Colchester, VT (US); Anthony D. Polson, Jericho, VT (US); Philip S. Stevens, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/635,068

(22) Filed: Dec. 10, 2009

(65) Prior Publication Data

US 2010/0088561 A1 Apr. 8, 2010

Related U.S. Application Data

(62) Division of application No. 11/772,340, filed on Jul. 2, 2007, which is a division of application No. 10/711,075, filed on Aug. 20, 2004, now Pat. No. 7,290,191.

(51) Int. Cl.
G01R 31/28 (2006.01)
G06F 1/12 (2006.01)
G06F 1/00 (2006.01)

(52) U.S. Cl. .............. 714/726; 714/724; 714/727; 714/729; 714/731; 713/400; 713/501

(58) Field of Classification Search ............ 714/724, 714/726, 727, 729, 731; 713/400, 501
See application file for complete search history.

(56) References Cited

U.S. PATENT DOCUMENTS

| | | | |
|---|---|---|---|
| 6,467,044 | B1 | 10/2002 | Lackey |
| 6,763,489 | B2 | 7/2004 | Nadeau-Dostie et al. |
| 7,058,866 | B2 | 6/2006 | Flanagan et al. |
| 7,185,249 | B2 | 2/2007 | Tkacik et al. |

OTHER PUBLICATIONS

Notice of Allowance (Mail Date Nov. 30, 2009) for U.S. Appl. No. 11/772,340, filed Jul. 2, 2007, Confirmation No. 9415.
Office Action (Mail Date Mar. 8, 2010) for U.S. Appl. No. 12/635,122, filed Dec. 10, 2009; Confirmation No. 8769.

*Primary Examiner*—John J Tabone, Jr.
(74) *Attorney, Agent, or Firm*—Schmeiser, Olsen & Watts; David Cain

(57) ABSTRACT

A method and circuits for testing an integrated circuit at functional clock frequency by providing a test controller generating control signals that assure proper latching of test patterns in scan chains at tester frequency and propagation of the test pattern through logic circuits being tested at functional clock frequency.

18 Claims, 16 Drawing Sheets

US 7,840,863 B2

FUNCTIONAL FREQUENCY TESTING OF INTEGRATED CIRCUITS

RELATED APPLICATIONS

This Application is a division of application Ser. No. 11/772,340 filed on Jul. 2, 2007 which is a division of application Ser. No. 10/711,075, U.S. Pat. No. 7,290,191, issued Oct. 30, 2007.

FIELD OF THE INVENTION

The present invention relates to the field of integrated circuit testing; more specifically, it relates to a circuit and method for testing integrated circuits at functional frequency.

BACKGROUND

Integrated circuits, especially logic circuits are often tested using scan chain methodology, wherein, test patterns are loaded into a set of scan-in latches, clocked through the combinational logic to be tested and the result pattern captured by scan-out latches for analysis. This testing has been traditionally performed at tester frequencies of about 30 to 100 MHz. However, with the advent of higher functional frequency integrated circuits, for example in about the 1 to 5 GHz range, circuits have been found to pass at tester frequency but fail at functional frequency. Therefore, there is a need for a method and circuit for testing integrated circuits at functional frequency.

SUMMARY

A first aspect of the present invention is a control circuit, an output of a first latch connected to an input of a second latch, an output of the second latch connected to an input of a third latch, the second latch having a feedback connection to an input of the first latch and the third latch having feedback connections to the first and the second latches; combinational logic coupled to the first, second and third latches, the combinational logic having a test signal input, a test clock input and a functional clock input; the feedback connection of the second latch further coupled through the combinational logic to a first control signal output; and the first latch coupled through the combinational logic to a second control signal output.

A second aspect of the present invention is a method of generating control signals, comprising: connecting an output of a first latch to an input of a second latch; connecting an output of the second latch to an input of a third latch; connecting the second latch through a feedback connection to an input of the first latch; connecting the third latch through feedback connections to the first and the second latches; coupling combinational logic to the first, second and third latches, the combinational logic having a test signal input, a test clock input and a functional clock input; coupling the feedback connection of the second latch through the combinational logic to a first control signal output; and coupling the first latch through the combinational logic to a second control signal output.

A third aspect of the present invention is a control circuit, comprising: an output of a first latch connected to an input of a second latch, an output of the second latch connected to an input of a third latch, the second latch having a feedback connection to an input of the first latch and the third latch having feedback connections to the first and the second latches; the combinational logic coupled to the first, second and third latches, the combinational logic having a test signal input, a scan enable input and a functional clock input; and the feedback connection of the second latch further coupled through the combinational logic to a scan control output.

A fourth aspect of the present invention a method of generating a control signal, comprising: connecting an output of a first latch to an input of a second latch; connecting an output of the second latch to an input of a third latch; connecting the second latch through a feedback connection to an input of the first latch; connecting the third latch through feedback connections to the first and the second latches; coupling combinational logic to the first, second and third latches, the combinational logic having a test signal input, a scan enable input and a functional clock input; and coupling the feedback connection of the second latch through the combinational logic to a scan control output.

A fifth aspect of the present invention is an integrated circuit, a test pin, a first test clock pin, a second test clock pin, a third test clock pin a functional clock pin, a scan-in pin, a scan-out pin and an enable pin; a test controller having a test input connected to the test pin, a first test clock input connected to the first test clock pin, a functional clock input connected to the functional clock pin, a first control output and a second control output; a clock splitter having a first clock input connected to the second test clock pin, a second clock input connected to the functional clock pin, a first control input connected to the first control output of the test controller, a second control input connected to the second control output and of the controller, an enable input connected to the enable pin, a ZB clock output and a ZC clock output; and an LSSD scan chain comprised of serially connected latches, a first stage of each latch having a first data input, a second data input and a C clock input connected to the ZC clock output of the clock splitter, an A CLK input connected to the third test clock pin, a second stage of each latch having a data output and a B clock input connected to the ZB clock output of the clock splitter, a data output of a previous latch connected to a first input pin of an immediately subsequent latch, a first data input of a first latch of the LSSD scan chain connected to the scan-in pin and a data output pin of a last scan chain latch of the scan chain connected to the scan-out pin.

A sixth aspect of the present invention is a method of testing an integrated circuit, comprising: providing a test pin, a first test clock pin, a second test clock pin, a third clock pin, a functional clock pin, a scan-in pin, a scan-out pin and an enable pin; providing a test controller having a test input connected to the test pin, a first test clock input connected to the first test clock pin, a functional clock input connected to the functional clock pin, a first control output and a second control output; providing a clock splitter having a first clock input connected to the second test clock pin, a second clock input connected to the functional clock pin, a first control input connected to the first control output of the test controller, a second control input connected to the second control output and of the controller, an enable input connected to the enable pin, a ZB clock output and a ZC clock output; and providing an LSSD scan chain comprised of serially connected latches, a first stage of each latch having a first data input, a second data input and a C clock input connected to the ZC clock output of the clock splitter, an A clock input connected to the third test clock pin, a second stage of each latch having a data output and a B clock input connected to the ZB clock output of the clock splitter, a data output of a previous latch connected to a first input pin of an immediately subsequent latch, a first data input of a first latch of the LSSD scan chain connected to the scan-in pin and a data output pin of a last scan chain latch of the scan chain connected to the scan-out pin.

A seventh aspect of the present invention is an integrated circuit, comprising: a test pin, a select enable pin, a functional clock pin, a scan-in pin and a scan-out pin; a test controller having a test input connected to the test pin, a functional clock input connected to the functional clock pin, a first control output and a second control output; a scan chain comprised of serially connected latches and corresponding multiplexers, a first stage of each latch having an data input, a clock input connected to a functional clock pin, a first control input connected to the first control output of the test controller, a second stage of each latch having a data output and a second control input connected to the second control output of the tester controller, a data output of a previous latch connected to a first selectable input of a multiplexer corresponding to an immediately subsequent latch, a selected output of the corresponding multiplexer connected to the data input of the immediately subsequent latch, a first selectable data input of a multiplexer of the scan chain connected to the scan-in pin and a data output of a last latch of the scan chain connected to the scan-out pin.

An eighth aspect of the present invention is a method of testing an integrated circuit, comprising: providing a test pin, a select enable pin, a functional clock pin, a scan-in pin and a scan-out pin; providing a test controller having a test input connected to the test pin, a functional clock input connected to the functional clock pin, a first control output and a second control output; providing a scan chain comprised of serially connected latches and corresponding multiplexers, a first stage of each latch having an data input, a clock input connected to a functional clock pin, a first control input connected to the first control output of the test controller, a second stage of each latch having a data output and a second control input connected to the second control output of the tester controller, a data output of a previous latch connected to a first selectable input of a multiplexer corresponding to an immediately subsequent latch, a selected output of the corresponding multiplexer connected to the data input of the immediately subsequent latch, a first selectable data input of a multiplexer of the scan chain connected to the scan-in pin and a data output of a last latch of the scan chain connected to the scan-out pin.

A ninth aspect of the present invention is circuit for testing an integrated circuit, comprising: a test pin, a select enable pin, a functional clock pin, a scan-in pin and a scan-out pin; a test controller having a test input connected to the test pin, a select enable input connected to the select enable pin, a functional clock input connected to the functional clock pin, and a control output; a scan chain comprised of serially connected latches and corresponding de-multiplexers, a first stage of each latch having an data input and a clock input connected to a functional clock pin, a second stage of each latch having a data output, a data output of a previous latch connected to a first selectable input of a multiplexer corresponding to an immediately subsequent latch, a selected output of the corresponding multiplexer connected to the data input of the immediately subsequent latch, a first selectable data input of a multiplexer of the scan chain connected to the scan-in pin and a selected output of a last latch of the scan chain connected to the scan-out pin and each multiplexer of the scan chain having a select input connected to the control output of the test controller.

A tenth aspect of the present invention is a method of testing an integrated circuit, comprising: providing a test pin, a select enable pin, a functional clock pin, a scan-in pin and a scan-out pin; providing a test controller having a test input connected to the test pin, a select enable input connected to the select enable pin, a functional clock input connected to the functional clock pin, and a control output; providing a scan chain comprised of serially connected latches and corresponding multiplexers, a first stage of each latch having an data input and a clock input connected to a functional clock pin, a second stage of each latch having a data output, a data output of a previous latch connected to a first selectable input of a multiplexer corresponding to an immediately subsequent latch, a selected output of the corresponding multiplexer connected to the data input of the immediately subsequent latch, a first selectable data input of a multiplexer of the scan chain connected to the scan-in pin and a selected output of a last latch of the scan chain connected to the scan-out pin and each multiplexer of the scan chain having a select input connected to the control output of the test controller.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

A cycle is defined herein as a transition of a signal from a first state to a second state, continuance of the signal at said second state for a fixed period of time, transition from the second state back to the first state and continuance of the signal at the first state for the same fixed period of time. A pulse is defined as a transition of a signal from a first state to a second state, continuance of the signal at the second state for a fixed period of time and transition from the second state back to the first state. A pin is defined herein as an integrated circuit pad, a circuit input or output or a circuit node.

Figure 1:
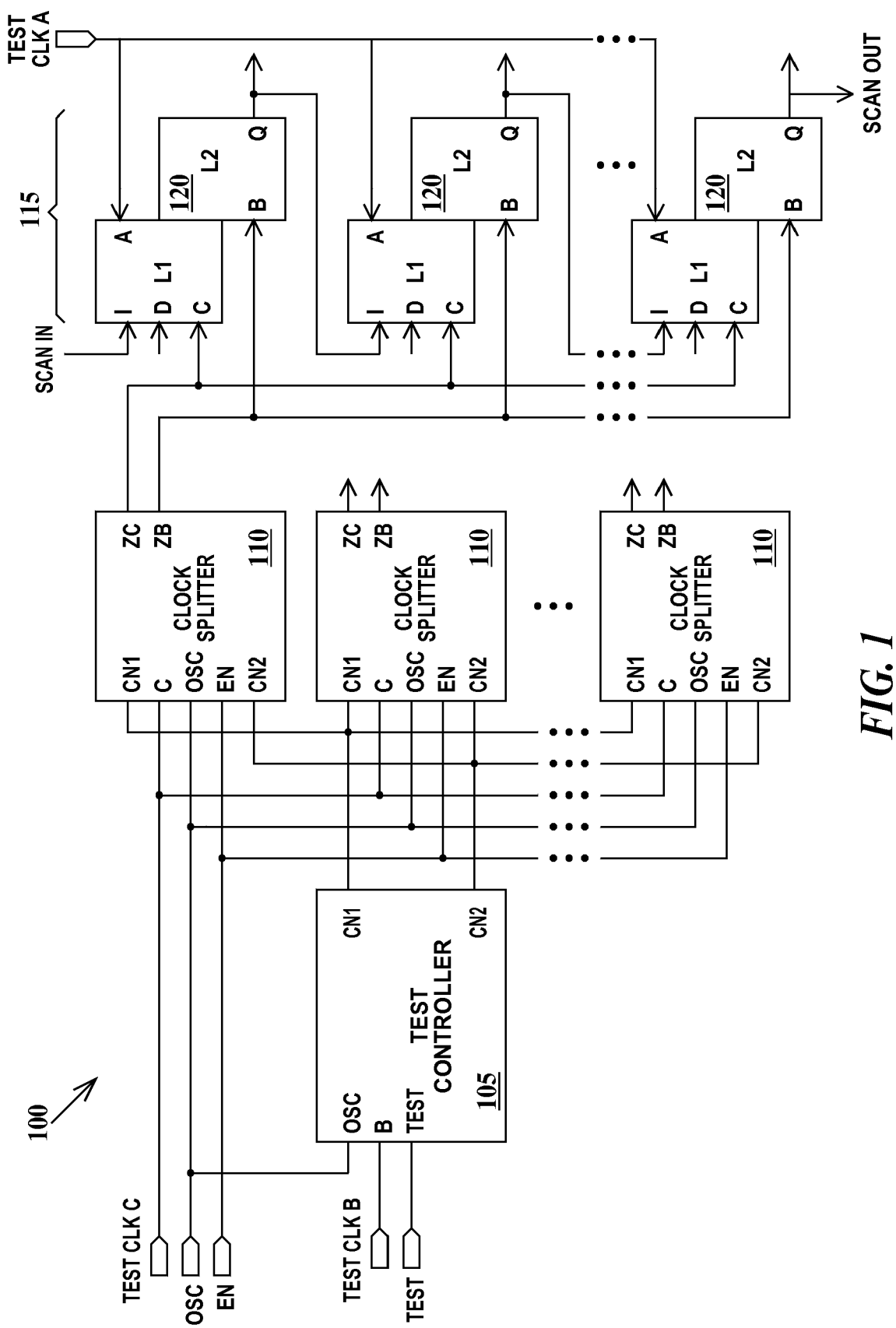
FIG. 1 is a schematic diagram of an integrated circuit test circuit according to a first embodiment of the present invention.

FIG. 1 is a schematic diagram of an integrated circuit test circuit according to a first embodiment of the present invention. The first embodiment of the present invention is an application of the present invention to level sensitive scan design (LSSD) testing methodology. In FIG. 1, integrated circuit 100 includes a test controller 105, a multiplicity of clock splitters 110 each supplying a ZC clock signal and a ZB clock signal to LSSD scan chains 115, each scan chain 115 including a multiplicity of L1L2 scan latches 120. Only one scan chain 115 is illustrated in FIG. 1, but each clock splitter 110 is capable of supplying the ZC and ZB clock signals to other scan chains 115.

Figure 3:
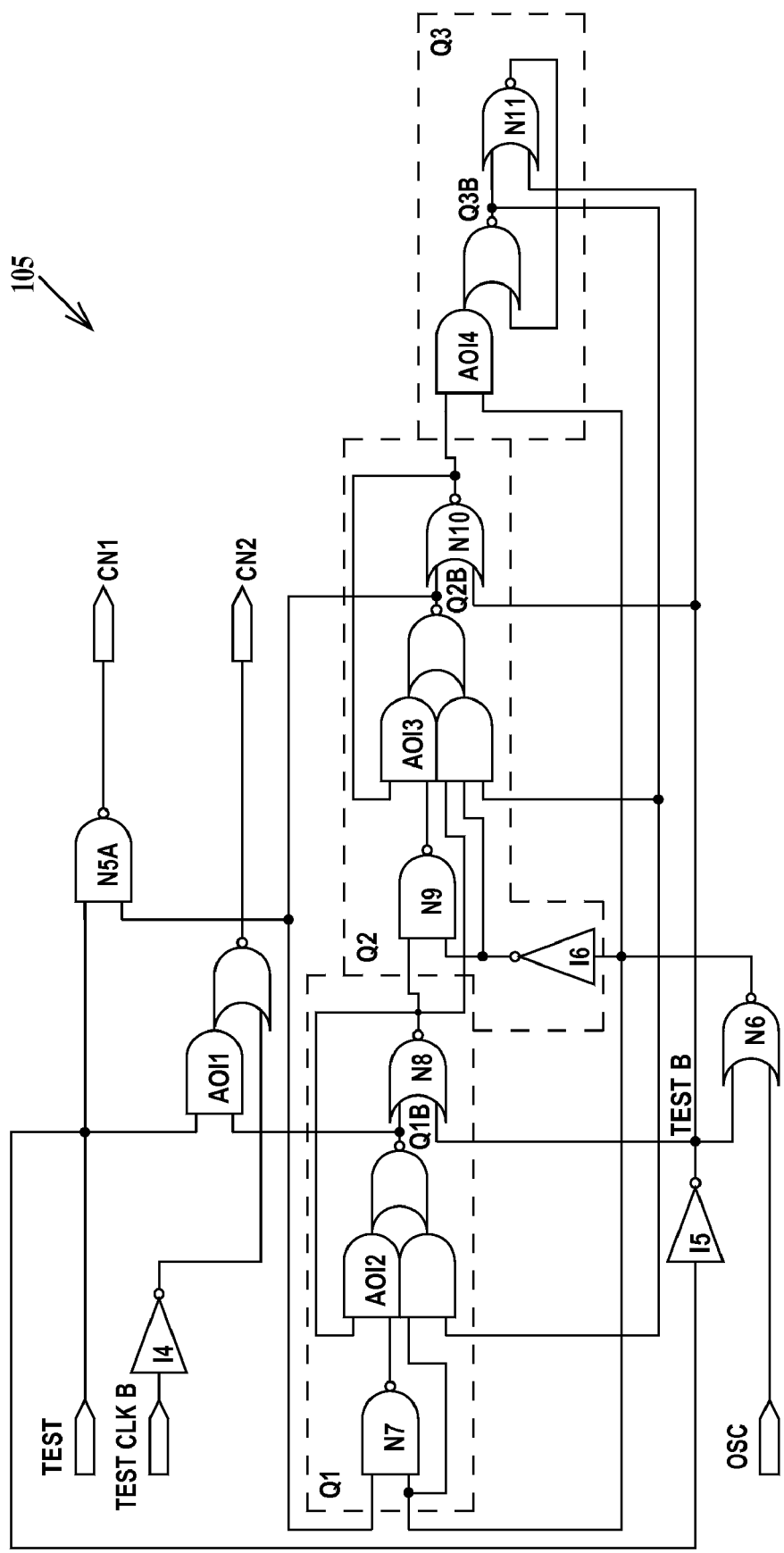
FIG. 3 is a schematic circuit diagram of a test controller of FIG. 1.

Test controller 105 includes a functional frequency clock input pin (OSC), a B test clock pin (B), a test mode pin (TEST), a first control signal output pin (CN1) and a second control signal output pin (CN2). Test controller receives a functional frequency clock signal OSC (this is the clock signal used during normal operational mode of the integrated circuit) at the OSC pin, a test clock B signal at the B pin and a test mode signal TEST at the TEST pin. Test controller generates a first control signal CN1 at the CN1 pin and a second control signal CN2 at the CN2 pin. Test controller 105 is illustrated in FIG. 3 and described infra.

Figure 2:
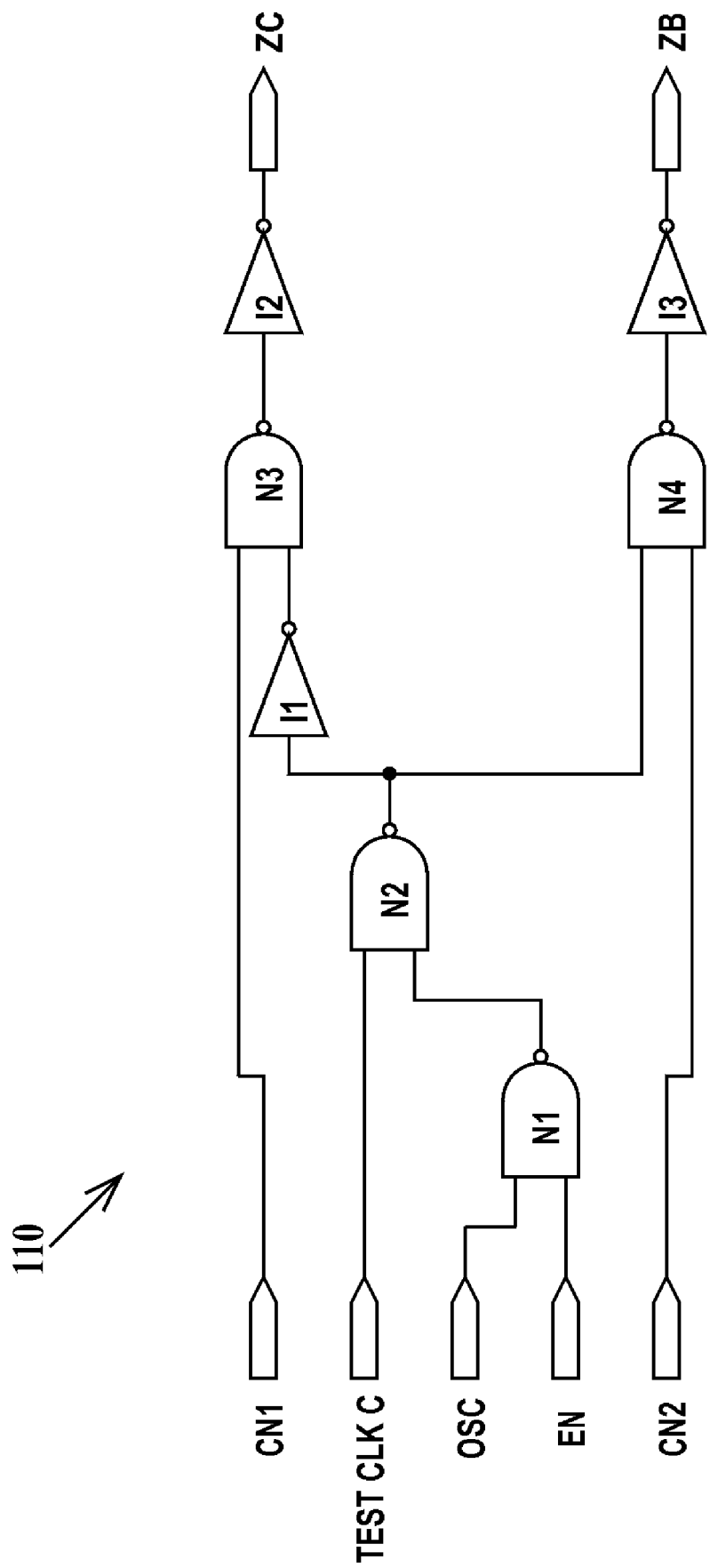
FIG. 2 is a schematic circuit diagram of an exemplary clock splitter of FIG. 1.

Each clock splitter 110 includes a CN1 input pin (CN1), a CN2 input pin (CN2), a C test clock input pin (C), a functional frequency clock input pin (OSC), an optional enable signal input pin (EN), a functional frequency C clock output pin (ZC) and a functional frequency B clock output pin (ZB). Each clock splitter receives from test controller 105, the first control signal CN1 at pin CN1, the second control signal CN2 at pin CN2, a TEST CLK C signal at pin C, the OSC signal at pin OSC and the EN signal at pin EN. Each clock splitter 110 generates a test/functional frequency clock ZC signal at pin ZC and a test/functional frequency clock ZB signal at pin ZB. Clock splitter 110 is illustrated in FIG. 2 and described infra.

Each L1L2 scan latch 120 in scan chain 115 includes an L1 section having an input pin (I), a data pin (D), an A clock signal pin (A) and a C clock signal pin (C) and an L2 section having a output pin (Q) and a B clock input pin (B). The D and Q pins are coupled to the combinational logic (not shown) being tested and all L1L2 scan latches 120 are coupled in series by connecting the Q pin of a previous L1L2 scan latch to the I pin of the immediately subsequent L1L2 scan latch. Test patterns are scanned in to the I pin of the first L1L2 scan latch 120 in scan chain 115 and resultant patterns are scanned out through the Q pin of the last L1L2 scan latch in the scan chain. The C pin of each L1L2 scan latch 120 receives the ZC signal and the B pin of each L1L2 scan latch receives the ZB signal from one of the clock splitters 110. L1L2 latches are well known in the art. The A pin of each L1L2 scan latch receives a TEST CLK A signal.

A test pattern is loaded into scan chain 115 by a series of TEST CK A-ZB pulses. The TEST CLK A pulse captures in the L1 section data present at the I pin and the ZB pulse moves the data from the L1 section to the L2 section. ZB is at tester frequency (TEST B CLK frequency) during this operation. A ZC pulse then moves data at pin D into the L1 section. The ZC pulse may be at tester frequency (TEST CLK C frequency) or functional frequency (OSC frequency). When ZC is at functional frequency, control signals CN1 and CN2 generated by test controller 105 eliminate the problem of "sequential depth" (the replacement of the test pattern with the data in the logic circuits upon switching ZB and ZC from tester frequency to functional frequency) by ensuring a functional frequency ZB pulse is issued first.

The tester generates TEST CLK A, TEST CLK B and TEST CLK C and in one example have frequencies of about 30 to 100 MHz, however these speeds may be expected to increase as testers become faster. OSC is generated by the integrated circuit chip itself and in one example has a frequency of about 1 to 5 GHz, however this speed may be expected to increase as integrated circuits become faster. Clock signals ZC and ZB are generated by clock splitters 110 and have the same frequency and the leading and trailing pulse edges of clock signals ZB and ZC are aligned respectively to leading and trailing clock edges of clock signal OSC.

FIG. 2 is a schematic circuit diagram of an exemplary clock splitter 110 of FIG. 1. In FIG. 2, clock splitter includes NAND gates N1, N2, N3 and N4 and inverters I1, I2 and I3. A first input of NAND gate N1 is coupled to OSC and a second input of NAND gate N1 is coupled to EN. The output of NAND gate N1 is coupled to a first input of NAND gate N2 and a second input of NAND gate N2 is coupled to TEST CLK C. The output of NAND gate N2 is coupled to a first input of NAND gate N4 and to a first input of NAND gate N3 through inverter I1. A second input of NAND gate N4 is coupled to CN2 and a second input of NAND gate N3 is coupled to CN1. The output of NAND gate N3 is coupled to the input of inverter I2, the output of inverter I2 being ZC. The output of nand gate N4 is coupled to the input of inverter I3, the output of inverter I3 being ZB.

When EN, CN1, CN2 and TEST CLK C are high, clock splitter generates ZB and ZC at functional frequency (OSC frequency) and the state of OSC controls the state of ZB and ZC. When OSC is high, ZB is high and ZC is low. When OSC is low, ZB is low and ZB is high.

When TEST CLK C is low, Clock splitter output ZC is low and ZB is controlled by CN2. When CN2 is low, ZB is low and when CN2 is high, ZB is high.

When TEST CLK C is high and CN2 is low, clock splitter ZB is low and ZC is controlled by CN1, OSC, and EN. When CN1 is high and either OSC is low or EN is low, ZC is high. When CN1 is low or when or when OSC and EN are both high, ZC is low.

FIG. 3 is a schematic circuit diagram of test controller 105 of FIG. 1. In FIG. 3, test controller 105 includes latches Q1, Q2 and Q3, which form a state machine. Latch Q1 includes a NAND gate N7, an And/Or/Invert (AOI) gate AOI2 and a NOR gate N8. The output of NAND gate N7 is connected to a first AND input of AOI2 and the output of AOI2 is connected to a node Q1B that is connected to a first input of NOR gate N8. A first input of NAND gate N7 is connected to a second AND input of AOI2 and the output of NOR gate N8 is connected to a third AND input of AOI2.

Latch Q2 includes an inverter I6, a NAND gate N9, and AOI3 and a NOR gate N10. The output of NAND gate N9 is connected to a first AND input of AOI3 and the output of AOI3 is connected to a node Q2B that is connected to a first input of NOR gate N10. The output of NOR gate N10 is connected to a second AND input of AOI3. The output of NOR gate N8 is connected to a third AND input of AOI3. Node Q2B is connected to a second input of NAND gate N7.

Latch Q3 includes an AOI4 and a NOR gate N11. The output of AOI4 is connected to a node Q3B that is connected to a first input of NOR gate N11. The output of NOR gate N11 is connected to an OR input of AOI4. The output of NOR gate N10 is connected to a first AND input of AOI4.

A fourth AND input of AOI2 and a fourth AND input of AOI3 are connected to node Q3B. The first input of NAND gate N7 is connected to a second AND input of AOI4.

A TEST signal is supplied the input of inverter I5 and the output of inverter I5 (a signal TESTB) is coupled to a second input of NOR gate N8, a second input of NOR gate N10 and a second input of NOR gate N11. The output of NOR gate N8 is also connected to a first input of NAND gate N9. TESTB is coupled to a first input of a NOR gate N6 and OSC is coupled to a second input of NOR gate N6. The output of NOR gate N6 is connected to the input of inverter I6 as well as to the first input of NAND gate N7 and a second AND input of AOI4. The output of inverter I6 is connected to a second input of NAND gate N9 and a fifth AND input of AOI3.

TEST is also coupled to a first input of a NAND gate N5A and a first AND input of AOI1. Node Q1B is connected to a second AND input of AOI1 and node Q2B is connected to a second input of AND gate N5A. A TEST CLK B is coupled to an input of an inverter I4 and the output of inverter I4 is connected to the OR input of AOI1. The output of NAND gate N5A is coupled to CN1, and the output of AOI1 is coupled to CN2.

A low on input TEST resets latches Q1, Q1, Q2 low in preparation for a test cycle at functional frequency. After TEST goes high, there are 2 startup states for Q1. If OSC was stopped low, Q1 will go high and if TEST CLK B is high, turn CN2 high in anticipation of positive functional clock pulses. If OSC was stopped high, a low in latch Q1 holds CN2 low until the first time OSC goes low setting Q1 high, allowing CN2 to go high if TEST CLK B is high. With TEST CLK B is high and CN2 high the circuit is ready to pass the first OSC pulse. When CN2 is high, then the Slave latch of the flip-flop can be updated.

At this time latch Q2 will remain low, holding CN1 low. This prevents the master latch of the flip-flops from being updated until the next time OSC goes high after Q1 went high. When OSC goes high after Q1 going high, Q2 will go high driving CN1 high. This then allows the master latch of the flip-flops to be updated.

Latch Q3 is low until the next time OSC goes high after Q2 went high. Latch Q3 starts the termination of the control sequence and will remain high insuring that the sequence does not restart until reset by the TEST signal going low.

Latch Q2 remains high holding CN1 high until OSC goes high after which Q2 goes low. The Master latch has been updated and Q2 low prevents future updates.

Latch Q1 is high holding CN2 high until OSC goes low after Q2 has gone low. At this time Q1 goes low. This stops the clock sequence and no further changes to the flip-flop data in either the master or slave latches can occur until the circuit has been reset by TEST going low.

Figure 4:
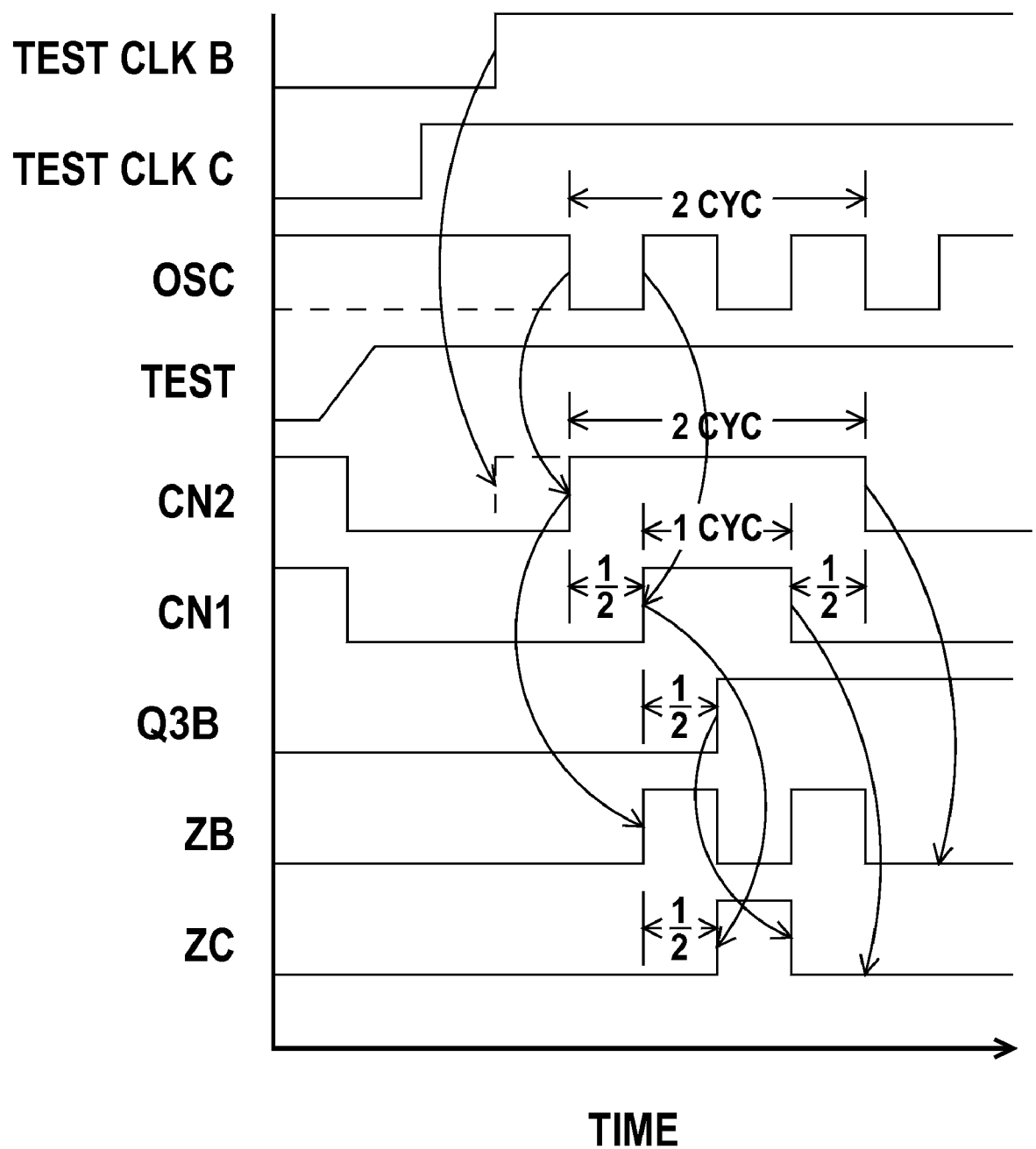
FIG. 4 is a timing diagram of the integrated test circuit of FIG. 1.

For the following discussion of the operation of test controller 105, reference to the timing diagram of FIG. 4 as well as FIGS. 1 through 3 will be helpful. Test controller 105 is off when TEST is low causing both CN1 and CN2 to remain high and integrated circuit 125 is in operational mode and there are no delay or switching impacts to clock splitters 110. Test controller 105 is in test mode when TEST is high and TEST CLK B is held high, forcing both CN1 and CN2 low. In test mode there is no change in CN1 or CN2 unless OSC is low or until the first falling edge of OSC. On the first falling edge of OSC, CN2 goes high. On the first rising edge of OSC, CN1 goes high. On the next rising edge of OSC CN1 goes low. On the next falling edge of OSC, CN2 goes low. Thereafter CN1 and CN2 remain low regardless of the state of OSC. Thus CN2 is high for two OSC cycles and CN1 is high for one OSC cycle, but CN1 and CN2 are a half an OSC cycle out of phase.

The result of clock splitter 110 (see FIG. 1) receiving these timed and coordinated CN1 and CN2 signals is to cause the clock splitter to generate a ZB high pulse followed by a ZC high pulse followed by a ZB high pulse, the ZC being high between ZB pulses with the ZB and ZC pulses at the OSC frequency and being a half cycle out of phase (see FIG. 4). The first ZB pulse high causes data in the L1 section of the L1L2 scan latches 120 (see FIG. 1) to be transferred (or launched) from the L1 section to the L2 section and into the combinatorial logic connected to the output Q of the L2 section. The ZC pulse high causes data on the D pin to be captured in the L1 section. The second ZB high pulse again moves data in the L1 section to the L2 section but with no further ZB or ZC pulses no further data transfer is possible. Thus, the test vector is flushed out of L1L2 scan latches 120 and replaced with the response to the combination logic being tested.

Because CN2 is a half OSC cycle ahead of ZB and ZC is a half OSC cycle ahead of ZC, enablement of the data capture of L1 stages and transfer between L1 and L2 stages is enabled and disabled a half an OSC cycle ahead of time thus relaxing timing constraints of integrated circuit 100 (see FIG. 1). Further, because further OSC pulses are ignored by test controller 105 (see FIG. 1), OSC can continue to run and circuits downstream on the clock tree will not be affected.

Test controller 105 (see FIG. 1) can be easily modified to respond to a negative clock design (i.e. where a falling OSC edge results in data transfer and a rising edge results in data capture). Test controller 105 can be further modified to provide additional transfer and/or, capture sequences by adding additional QX latch stages.

FIG. 4 is a timing diagram of the integrated test circuit of FIG. 1. The timings of TEST CLK B, TEST CLCK C, OSC, TEST, CN1 CN2 have been discussed supra. Q3B represents the timing of the signal on node Q3B (see FIG. 3) during operation of test controller 100 (see FIG. 3).

Figure 5:
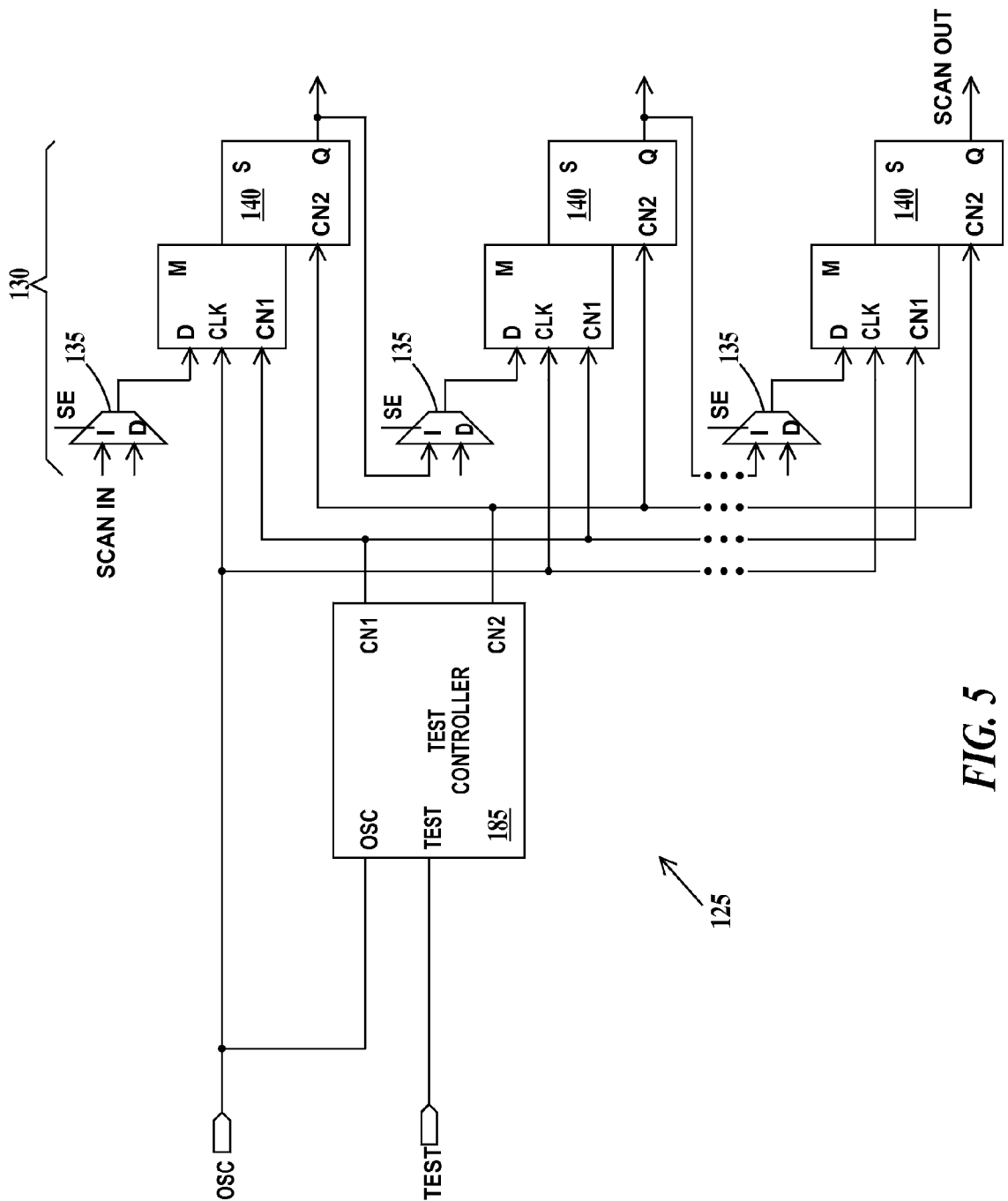
FIG. 5 is a schematic diagram of an integrated circuit test circuit according to a second embodiment of the present invention.
Figure 8:
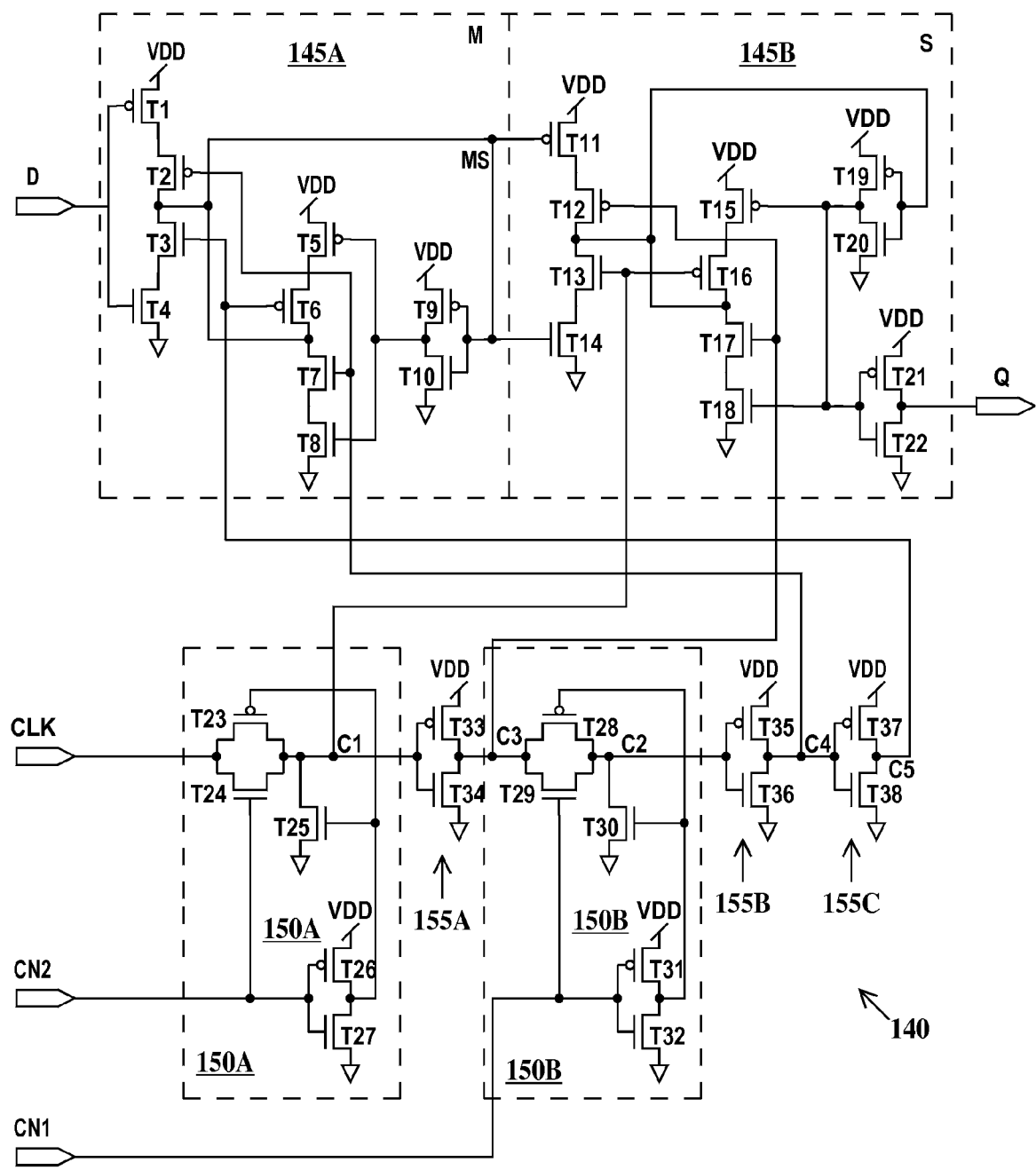
FIG. 8 is a schematic circuit diagram of an exemplary implementation of an master/slave scan latch of FIG. 5.

FIG. 5 is a schematic diagram of an integrated circuit test circuit according to a second embodiment of the present invention. The second embodiment of the present invention is an application of the present invention to MUX Scan Latch testing methodology. In FIG. 5, integrated circuit 125 includes test controller 185, and a scan chain 130. As this is a Mux Scan design, a separate TEST CLK B is not needed. Scan chain 130 includes a multiplicity of multiplexers 135 and a corresponding multiplicity of master/slave flip flop (MS) scan latches 140. Each MS scan latch 140 in scan chain 130 includes a master (M) section having a data pin (D), CLK clock signal pin (CLK) and first control pin (CN1) and a slave (S) section having a output pin (Q) and a second control pin (CN2). MS scan latches 140 are illustrated in FIG. 8 and described infra. Each multiplexer 135 in scan chain 130 includes an input pin (I), a data pin (D) a select enable pin (SE) which selects whether pin I or pin D is coupled to the output of the de-multiplexer based on an SE signal from the tester.

The D pin of each multiplexer 135 and the Q pin of each MS scan latch are coupled to the combinational logic (not shown) being tested. The output of each multiplexer 135 is connected to the D pin of a corresponding MS scan latch 140 and all MS scan latches are coupled in series by connecting the Q pin of a previous MS scan latch to the I pin of a multiplexer 135 connected to an immediately subsequent MS scan latch. The CLK pin of each MS scan latch 140 is connected to the functional clock pin. The CN1 pin of each MS scan latch 140 is connected to the CN1 of test controller 105 and the CN2 pin of each MS scan latch is connected to the CN2 pin of the test controller.

While MS latches are well known in the art, MS scan latches 140 are modified to accept and function with the CN1 and CN2 signals. MS scan latches 140 are illustrated in FIG. 8 and described infra. The CLK pin of each MS scan latch receives OSC. The present MS scan latches 140 generate an OSC BAR (the inverse of OSC) internally, the S section being responsive to OSC and the M section being responsive to OSC BAR. A separate OSC BAR may be supplied.

Test patterns are scanned in to the I pin of the first multiplexer 135 in scan chain 130 and resultant patterns are scanned out through the Q pin of the last MS scan latch 140 in the scan chain. A test pattern is scanned into scan chain 130 by setting SE to select I inputs and TEST low (off), and OSC is cycled to load the test pattern into scan chain 130.

The operation of integrated circuit 125 is similar to that of integrated circuit 100 of FIG. 1. Test controller 185 is off when TEST is low causing both CN1 and CN2 to remain high. Integrated circuit 125 is in operation mode when TEST is low. In operational mode when SE is held low, multiplexers 135 select D. MS scan latches 140 operate normally capturing the state at the M section of MS scan latch 140 and allowing the S section of MS scan latch 140 to sample the M section and present the state of the M section at the output of the latch on the rising edge of OSC. In scan mode when SE is high, multiplexers 135 select I and MS scan latch 140 functions as described for normal operation except that the input for the M section is now from I. Integrated circuit 125 is sequenced into test mode by holding SE high while bringing TEST high, forcing both CN1 and CN2 low (CN2 may remain high if OSC stopped low). This preserves the scan state of the master and S sections of latch 140 and then SE is brought low causing multiplexers 135 to select D. In test mode there is no change in CN1 or CN2 unless OSC is low or until the first falling edge of OSC. On the first falling edge of OSC, CN2 goes high. This enables the slave portion of MS scan latch 140 to be updated on the next rising edge of OSC. CN1 is low at this time preventing the M section of MS scan latch 140 from sampling D and preserving the scan in contents. On the first rising edge of OSC, the slave portion of MS scan latch 140 samples the state of the master portion of MS scan latch 140 and presents the data to the downstream logic. CN1 also goes high enabling the M section of MS scan latch 140 to sample the logic response (D) when OSC next goes low. On the next rising edge of OSC, the S section of MS scan latch 140 now samples the state of the M section of MS scan latch 140 and presents this state to the downstream logic. Also at this time CN1 goes low, this prevents the M section of MS scan latch 140 from changing due to the new data presented to the logic. On the next falling edge of OSC, CN2 goes low and prevents the slave portion of MS scan latch 140 from changing. Thereafter CN1 and CN2 remain low and the master and S sections of MS scan latch 140 contain the response of the logic to the scanned in test vector regardless of the state of OSC. Thus CN2 is high for two OSC cycles and CN1 is high for one OSC cycle, but CN1 and CN2 are a half an OSC cycle out of phase. CN2 going high causes data in the M section of MS scan latch 140 to be transferred (or launched) from the M section to the S section and into the combinatorial logic connected to the S section output on the next rising edge of OSC. Again, this enablement is a half an OSC clock cycle early. On a rising edge of OSC, CN1 going high causes data on the Q pin of the previous MS scan latch 140 is captured in the M section of the subsequent MS scan latch. Again, this enablement is a half an OSC clock cycle early. On the next rising edge of OSC, CN1 goes low and stays low. Again, this disablement is a half an OSC cycle early. On the next OSC falling edge, CN2 goes low and stays low. Again, this disablement is a half an OSC cycle early. Because CN2 changes on the falling edge of OSC and CN1 changes on the rising edge of OSC, enablement of the data capture of M stages and transfer between M and S stages is enabled and disabled a half an OSC cycle ahead of time thus relaxing timing constraints of integrated circuit 125.

Further, because further OSC pulses are ignored by test controller 185 (see FIGS. 5 and 6), OSC can continue to run and circuits downstream on the clock tree will not be affected.

Figure 6:
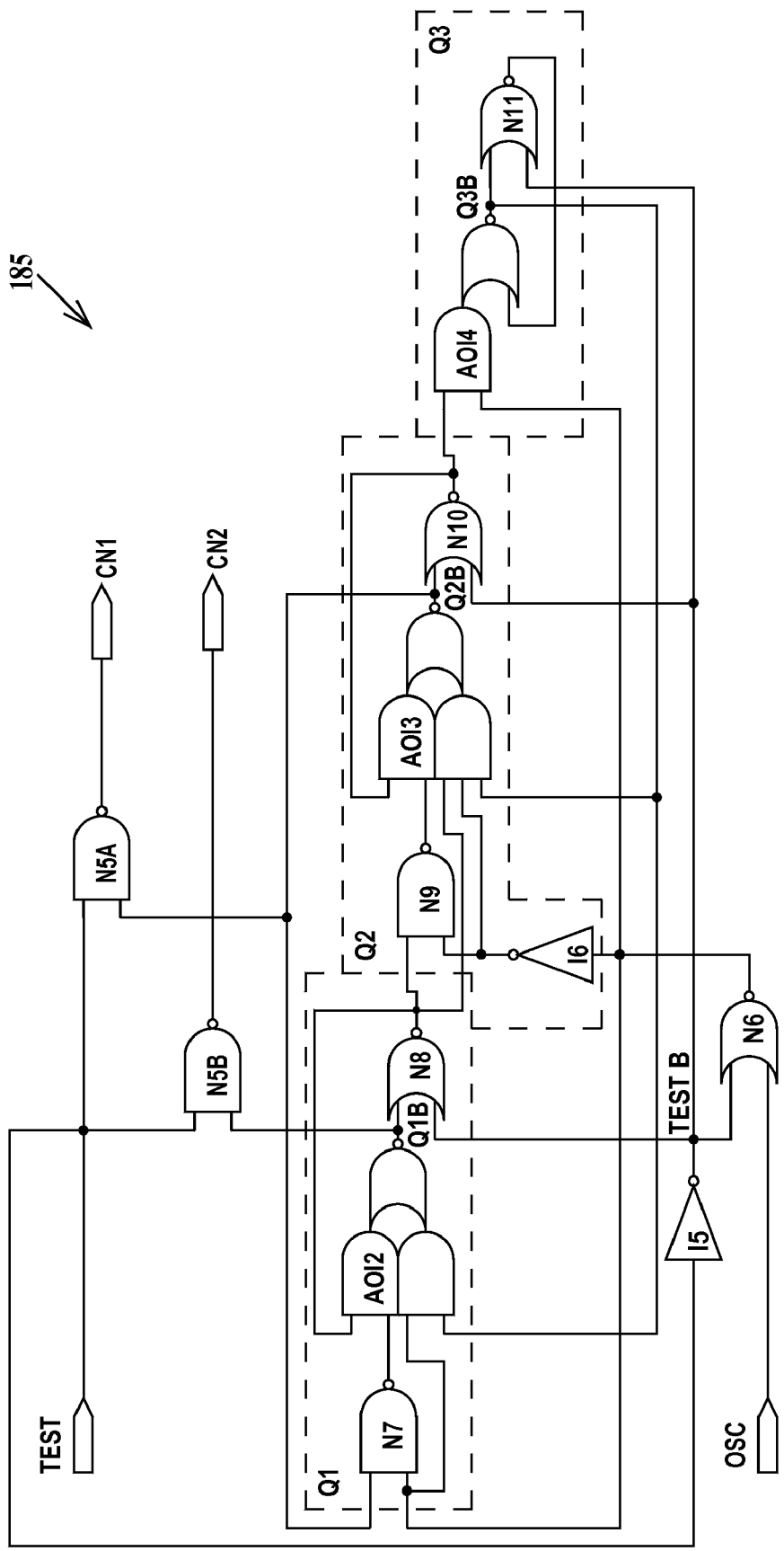
FIG. 6 is a schematic circuit diagram of a test controller of FIG. 5.

FIG. 6 is a schematic circuit diagram of test controller 185 of FIG. 5. Test controller 185 is similar to test controller 105 of FIG. 3 except the TEST CLK B pin (there is no longer a TEST CLK B), inverter I4 and AOI1 of FIG. 3 are replaced with a NAND gate N5B.

Figure 7:
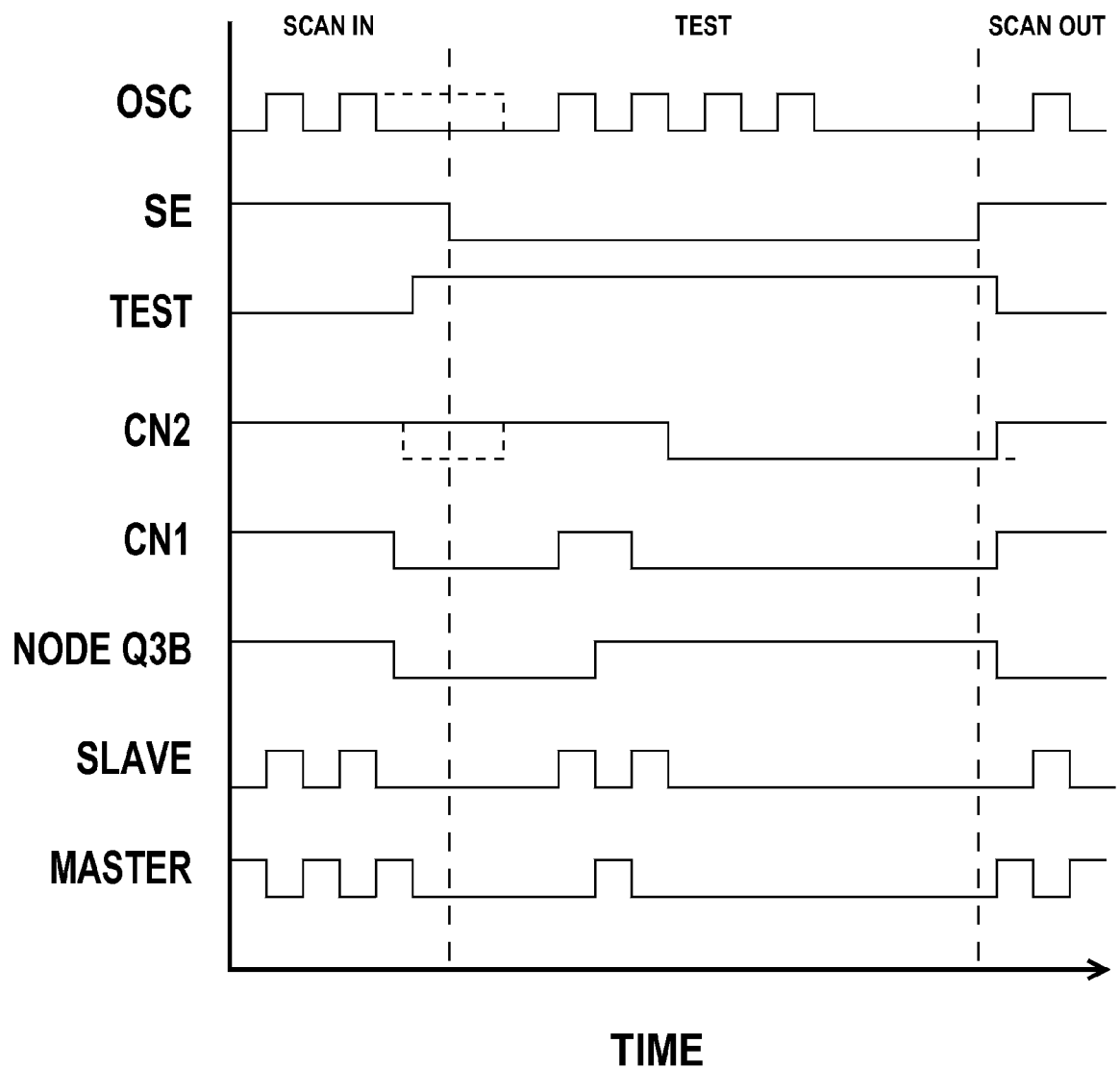
FIG. 7 is a timing diagram of the integrated test circuit of FIG. 5.

FIG. 7 is a timing diagram of the integrated test circuit 125 of FIG. 5. The timings of OSC, SE, TEST, Q3B, CN1 CN2 have been discussed supra. Integrated circuit 125 is sequenced from scan mode to test mode and then back scan mode as shown.

Test controller 185 (see FIG. 6) can be easily modified to respond to a negative clock design (i.e. where a falling OSC edge results in data transfer and a rising edge results in data capture). Test controller 185 (see FIG. 6) can be further modified to provide additional transfer and/or, capture sequences by adding additional QX latch stages.

FIG. 8 is a schematic circuit diagram of an exemplary implementation of MS scan latch 140 of FIG. 5. Other implementations using a different base latch design and adding CN1 and CN2 inputs are possible. In FIG. 8, MS scan latch 140 includes an M section 145A and an S section 145B, AND gates 150A and 150B and inverters 155A, 155B and 155C. M section 145A includes PFETs T1, T2, T5, T6 and T9 and NFETs T3, T4, T7, T8 and T10 and an output node MS. S section 145B includes PFETs T11, T12, T15, T16, T19 and T21 and NFETs T13, T14, T17, T18, T20 and T22. AND gate 150A includes PFETs T23 T26 and NFETs T24, T25 and T27 and an output node C1. AND gate 150B includes PFETs T28, T31 and NFETs T29, T30 and T32 and an output node C2. Inverter 155A includes a PFET T33 and an NFET T34 and an output node C3. Inverter 155B includes a PFET T35 and an NFET T36 and an output node C4. Inverter 155C includes a PFET T37 and an NFET T38 and an output node C5.

The D input pin of MS scan chain latch 140 is connected to the gates of PFET T1 and NFET T4 of M section 145A, and the Q output pin of MS scan chain latch 140 is connected to the drains of PFET T21 and NFET T22 of S section 145B. The CLK pin of MS scan latch 140 is connected to the drains PFET T23 and NFET T24 of AND gate 150A. The CN2 pin of MS scan chain latch 140 is connected to the gates of PFET T26 and NFETs T24 and T27 of AND gate 150A. Output node C1 of AND gate 150A is connected to the gates of PFET T33 and NFET T34 (the input) of inverter 155A. The drains of PFET T33 and NFET T34 (output node C3) of inverter 155A are connected to the drains of PFET T28 and NFET T29 of AND gate 150B. The CN1 pin of MS scan chain latch 140 is connected to the gates of PFET T31 and NFETs T29 and T32 of AND gate 150B. Output node C2 of AND gate 150B is connected to the gates of PFET T35 and NFET T36 (the input) of inverter 155B. The drains of PFET T35 and NFET T36 (output node C4) are connected to the gates of PFET T37 and NFET T38 (the input) of inverter 155C. The drains of PFET T37 and NFET T38 (output node C5) of inverter 155C are connected to the gates of NFET T3 and PFET T6 of M section 145A. Output node C4 of inverter 155B is connected to the gates of PFET T2 and NFET T7 of M section 145A. Output node C3 of inverter 155A is connected to the gates of PFET T12 and NFET T17 of S section 145B. Output node C1 of AND gate 150A is connected to the gates of PFET T16 and NFET T13 of S section 145B.

AND gate 150B allows CN1 to control by latching of data on the D pin by M section 145A by gating CLK. AND gate 150A allows CN2 to control by transfer of data in M section 145A into S section 145B by gating CLK.

Figure 9:
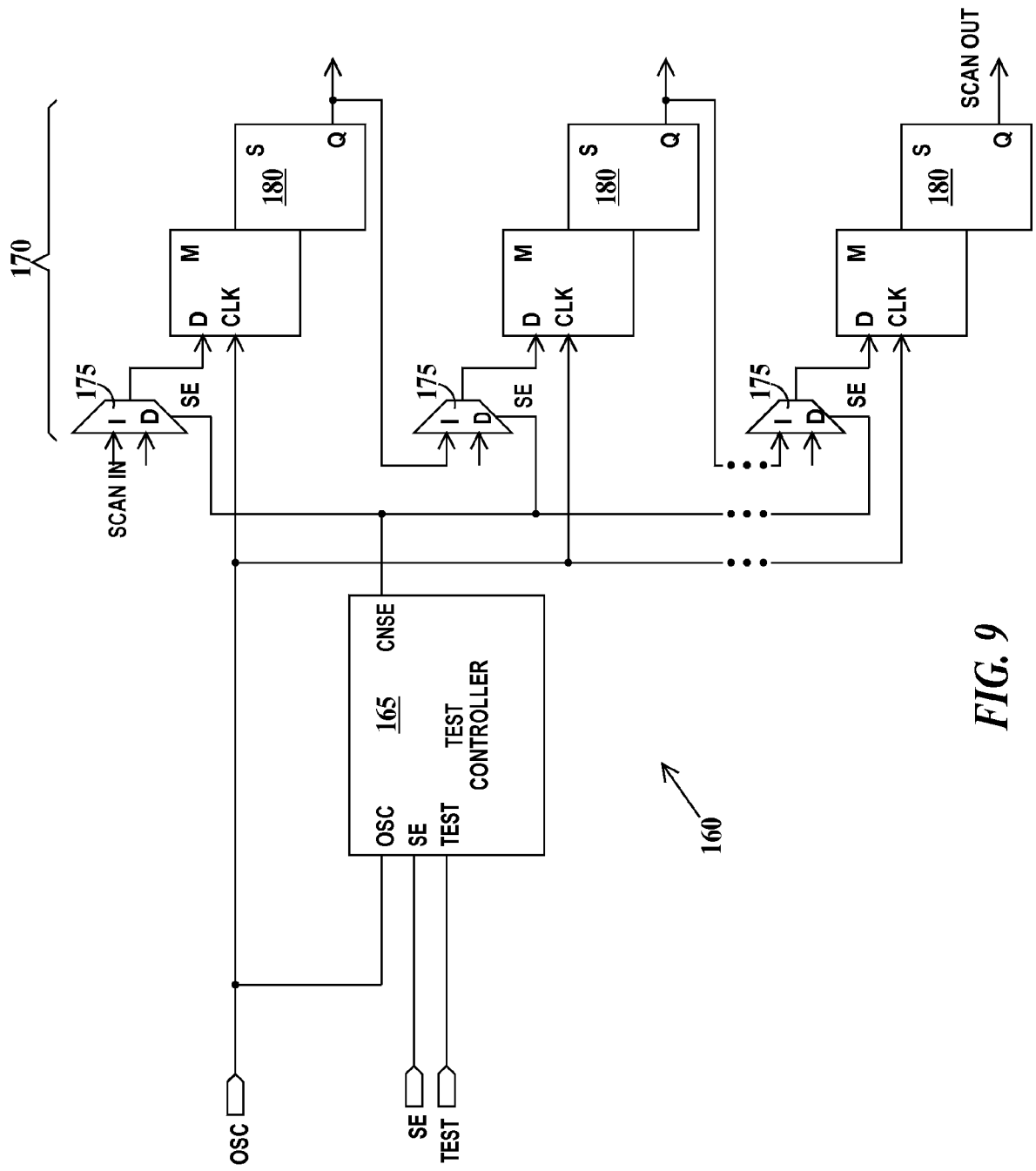
FIG. 9 is a schematic diagram of an integrated circuit test circuit according to a third embodiment of the present invention.

FIG. 9 is a schematic diagram of an integrated circuit test circuit according to a third embodiment of the present invention. The third embodiment of the present invention is also an application of the present invention to MUX Scan Latch testing methodology, but using unmodified or standard MS latches. In FIG. 9, integrated circuit 160 includes test controller 165, and a scan chain 170. Scan chain 170 includes a multiplicity of multiplexers 175 and a corresponding multiplicity of MS scan latches 180. Each MS scan latch 180 in scan chain 170 includes an M section having a data pin (D) and a clock signal pin (CLK) and an S section having a output pin (Q). Each multiplexer 175 in scan chain 170 includes an input pin (I), a data pin (D) a select enable pin (SE) which selects whether pin I or pin D is connected to the output of the de-multiplexer. MS scan latches 180 are illustrated in FIG. 11 and described infra. Test controller 165 includes an OSC input pin, a TEST input pin (for respectively receiving the OSC and TEST signals described supra) a select enable input pin for receiving the SE signal (described supra) from the tester, and a CNSE output pin for a CNSE signal that controls the select function of each multiplexer 175. Test controller 165 is illustrated in FIG. 10 and described infra.

The D pin of each de-multiplexer 175 and the Q pin of each MS scan latch are coupled to the combinational logic (not shown) being tested. The output of each multiplexer 175 is coupled to the D pin of a corresponding MS scan latch 180 and all MS scan latches are coupled in series by connecting the Q pin of a previous MS scan latch to the I pin of a multiplexer 175 connected to an immediately subsequent MS scan latch. The SE pin of each de-multiplexer 175 is connected to the CNSE pin of test controller 165 and each CLK pin each MS scan latch 180 is coupled to the functional clock pin. The present MS scan latches 140 generate CLK BAR (the inverse of CLK) internally, the S section being responsive to CLK and the M section being responsive to CLK BAR. A separate CLK BAR may be supplied.

Test patterns are scanned in to the I pin of the first de-multiplexer 175 in scan chain 170 and resultant patterns are scanned out through the Q pin of the last MS scan latch 180 in the scan chain. A test pattern is scanned into scan chain 170 by setting TEST to low (off) and SE to select the I inputs of de-multiplexers 175 and the test pattern into scan chain 170 as OSC cycles.

Figure 10:
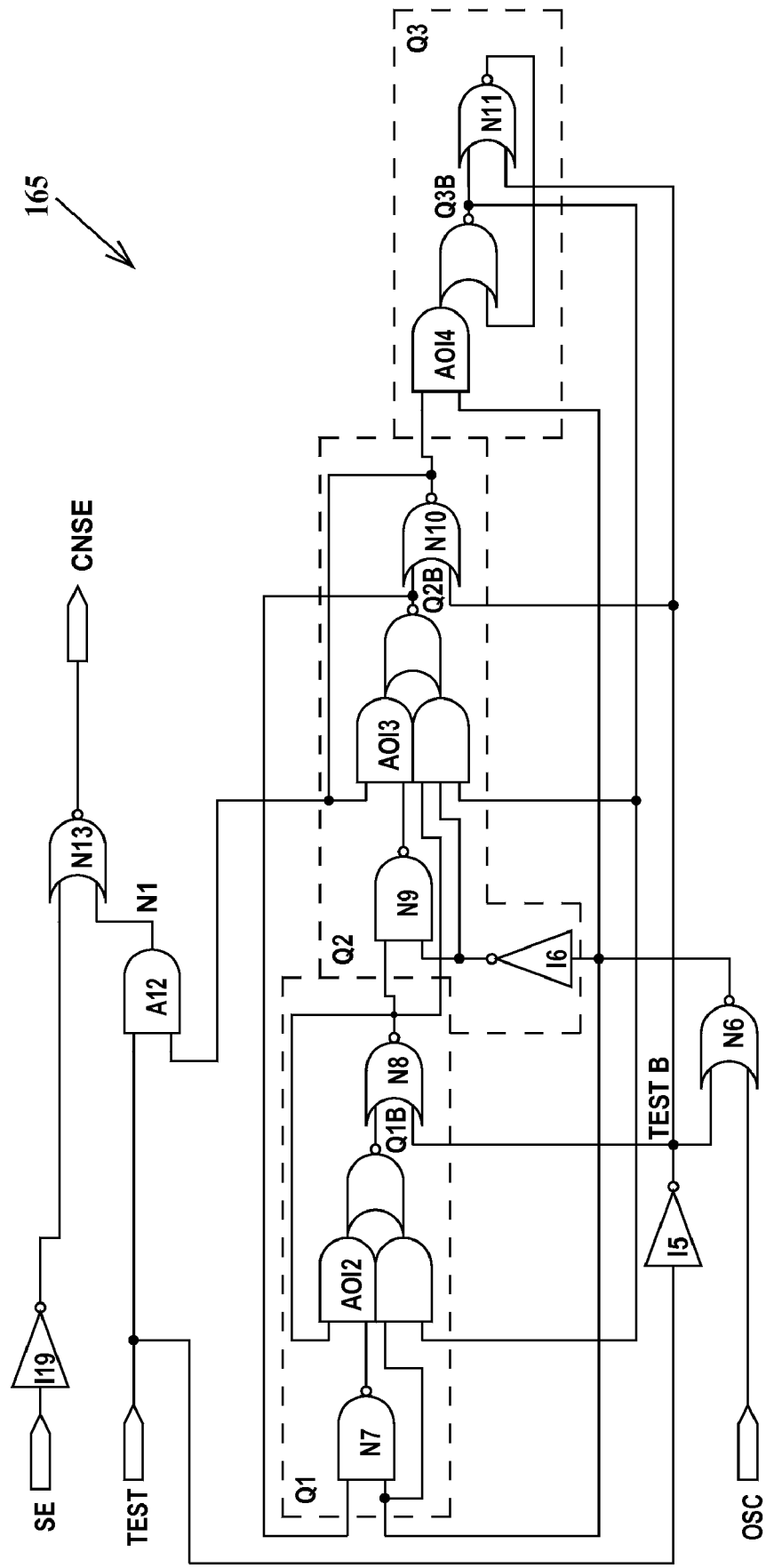
FIG. 10 is a schematic circuit diagram of a test controller of FIG. 9
Figure 11:
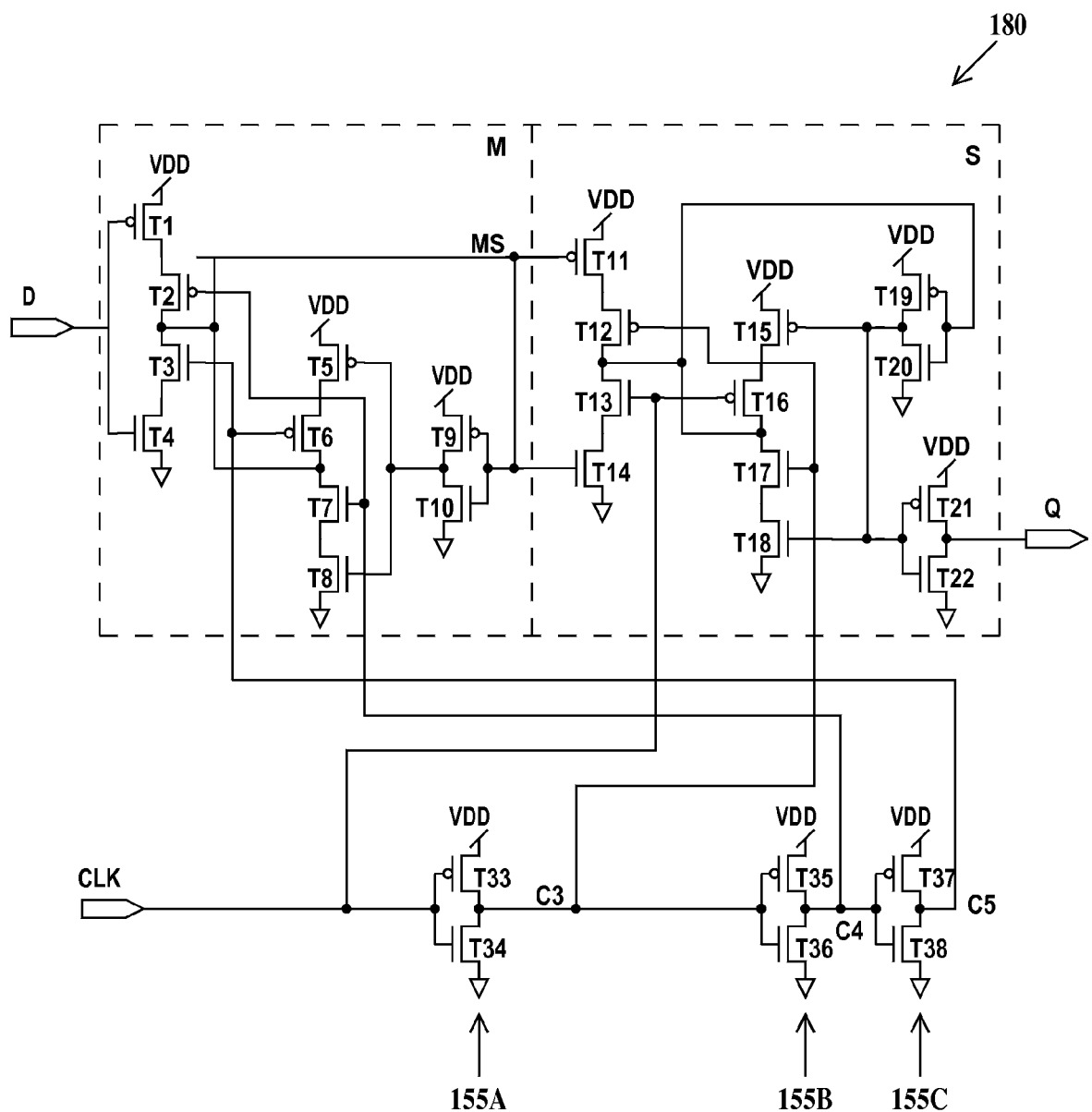
FIG. 11 is a schematic circuit diagram of an exemplary implementation of an master/slave scan latch of FIG. 9.

FIG. 10 is a schematic circuit diagram of test controller 165 of FIG. 9. Tester control 165 is similar to tester controller 105 except AOI1 and NAND gate N5A are replaced with AND gate A12 and NOR gate N13, TEST CLK B is replaced with SE, CN1 and CN2 are replaced with CNSE. TEST is coupled to a first input of AND gate N12 and node Q2B is coupled to a second input of AND gate A12. SE is coupled through an inverter I19 to a first input of NOR gate N13, the output of AND gate A12 (a node N1) is connected to a second input of NOR gate N13 and the output of NOR gate N13 is connected to a CNSE output pin.

FIG. 11 is a schematic circuit diagram of an exemplary implementation of MS scan latches 180 of FIG. 9. In FIG. 9, MS scan latch 180 is similar to MS scan latch 140 of FIG. 8, except there are no AND gates 150A and 150B or CN1 or CN2 signals, CLK is connected directly to the input of inverter 155A and node C3 is connected directly to the input of inverter 155B.

For the following discussion of the operation of integrated circuit 160, reference to FIGS. 9 through 12 will be helpful. Returning to FIG. 9, during operation of integrated 160, test controller 165 is off when TEST is low causing CNSE to follow the state of SE. If SE is low the multiplexers and integrated circuit 160 are in operational mode and there is no delay or switching impact to scan chain 170. Test controller 165 is in test mode when TEST is high and CNSE now has a more complex logical function. In the functional speed test mode, SE remains high and then TEST is pulled high. OSC can be stopped high or low. Then two at speed clock pulses are propagated down OSC. On a first rising edge of OSC, the S section of MS scan latch 180 samples the contents of the M section of MS latch 180 and presents this value to the logic under test. The M section of MS scan latch 180 contains the values that were scanned in for test. CNSE is also pulled low switching the multiplexer 175 from passing I to passing D to the M section of MS scan latches 180 to sample the data on their D pins on the next falling edge of OSC. Again this enablement is a half a cycle early. On the next rising edge of OSC, the S section of MS scan latches 180 samples the data on the m section of MS scan latches 180. CNSE also goes high and stays high. This prevents any further data captures from the combinational logic occurring on the M section of MS scan latches 180. Further OSC cycle scan-out the test data, it would be preferred at this point to switch back to scan mode and use the slower speed scan clock. TEST would be preferably pulled high but this is not required.

Figure 12:
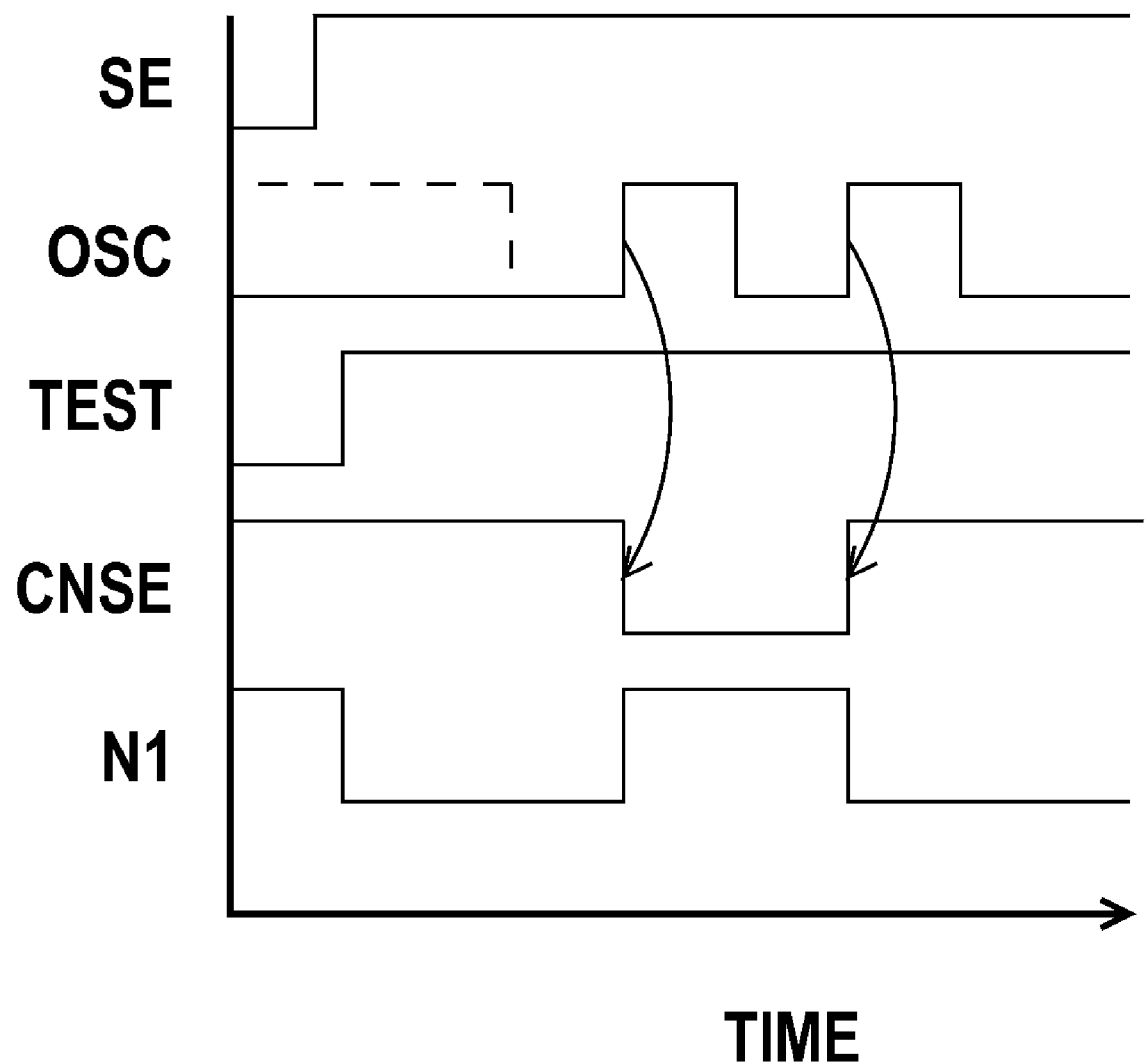
FIG. 12 is a timing diagram of the integrated test circuit of FIG. 9.

FIG. 12 is a timing diagram of the integrated test circuit of FIG. 9. The timing of SE, OSC, TEST and CNSE have been described supra. Node N1 is high when TEST is low, goes low when TEST goes high, goes high again when CNSE goes low and goes low again (and stays low) when CNSE goes high.

The first embodiment of the present invention described supra and illustrated in FIG. 1, utilized a separate test controller and clock splitter. The fourth and fifth embodiments of the present invention utilize a combined test controller and clock splitter circuit.

Figure 13:
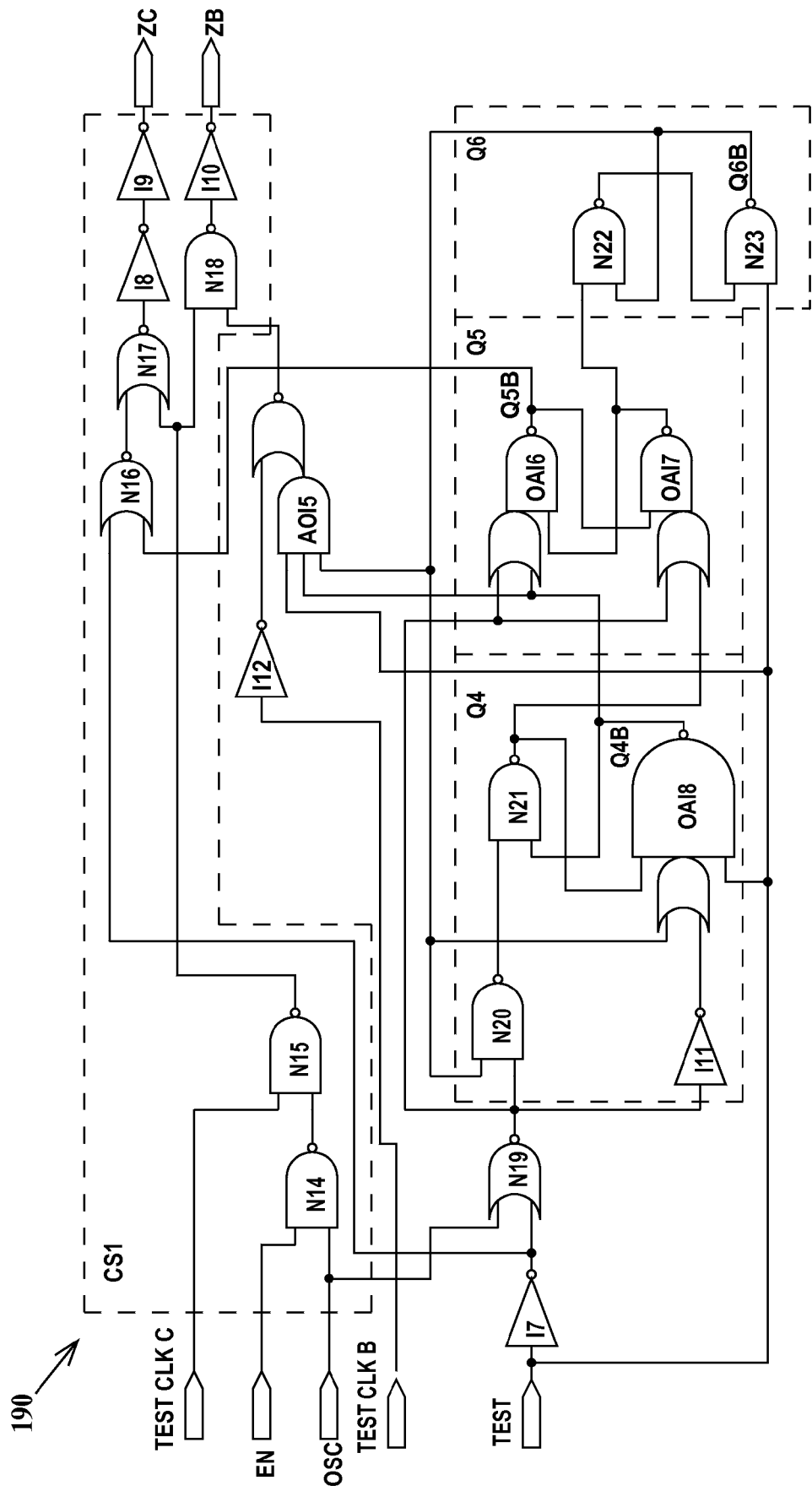
FIG. 13 is a schematic circuit diagram of a first compact clock splitter according to the present invention.

FIG. 13 is a schematic circuit diagram of a first compact clock splitter according to the present invention. In FIG. 13, a compact test splitter 190 includes a first latch Q4, a second latch Q5, a third latch Q6, (latches Q4, Q5 and Q6 forming a state machine) an output stage CS1, inverters I7 and I12, NOR gate N19, AOI5, a C test clock pin (TEST CLK C), an enable pin (EN), an OSC pin (OSC), a B test clock pin (TEST CLK B), a mode pin (TEST) a first output pin (ZC) and a second output pin (ZB).

First latch Q4 includes NAND gates N20 and N21, inverter I11 and Or/And/Invert gate (OAI) OAI8. The output on NAND gate N20 is connected to a first input of NAND gate 21, the output of inverter I11 is connected to a first OR input of OAI8. The output of OAI8 (node Q4B) is connected to a second input of NAND gate N21 and the output of NAND gate N21 is connected to a first AND input OAI8.

Second latch Q5 includes an OAI6 and an OAI7. The output of OAI6 (node Q5B) is connected to an AND input of OAI7 and the output of OAI7 is connected to the AND input of OAI6.

Third latch Q6 includes NAND gates N22 and N23. The output of NAND gate N22 is connected to a first input of NAND gate N23, and the output of NAND gate N23 (node Q6B) is connected to a first input of NAND gate N22.

Output stage CS1 includes NAND gates N14, N15, and N18, NOR gates N16 and N17 and inverters I9 and I10. TEST CLK C is connected to a first input of NAND gate N15. EN is connected to a first input of NAND gate N14. OSC is connected to a second input of NAND gate N14 and a first input of NOR gate N19. The output of NAND gate N14 is connected to a second input of NAND gate N15, and the output of NAND gate N15 is connected to a first input of NOR gate N17 and a first input of NAND gate N18. The output of NOR gate N16 is connected to a second input of NOR gate N17. The output of NOR gate N17 is coupled to ZC through serially connected inverters I8 and I9. The output of NAND gate N18 is coupled to ZB through inverter I10.

Interconnections between output stage CS1 and latch stages Q4, Q5 and Q6 are as follows: TEST CLK B is coupled to the OR input of AOI5 through inverter I12. The output of AOI5 is connected to a second input of NAND gate N18. TEST is coupled to a second input of NOR gate N19 and a first input of NOR gate N16 through inverter I7, and is connected to a second AND input of OAI8, a first AND input of AOI5 and a second input of NAND gate N23. The output of NAND gate N23 (Q6B) is also connected to a second AND input of AOI5, a second OR input of OAI8 and a first input of NAND gate N20. The output of NOR gate N19 is connected to a second input of NAND gate N20, the input of inverter I11, a first OR input of OAI6 and a first OR input of OAI7. The output of OAI8 (Q4B) is also connected to a second OR input of OAI6 and a third AND input of AOI5. The output of OAI7 is also connected to a second input of NAND gate N22, and the output of OAI6 (Q5B) is also connected to a second input of NOR gate N16, and the output of NAND gate 21 is also connected to a second OR input of OAI17.

Figure 14:
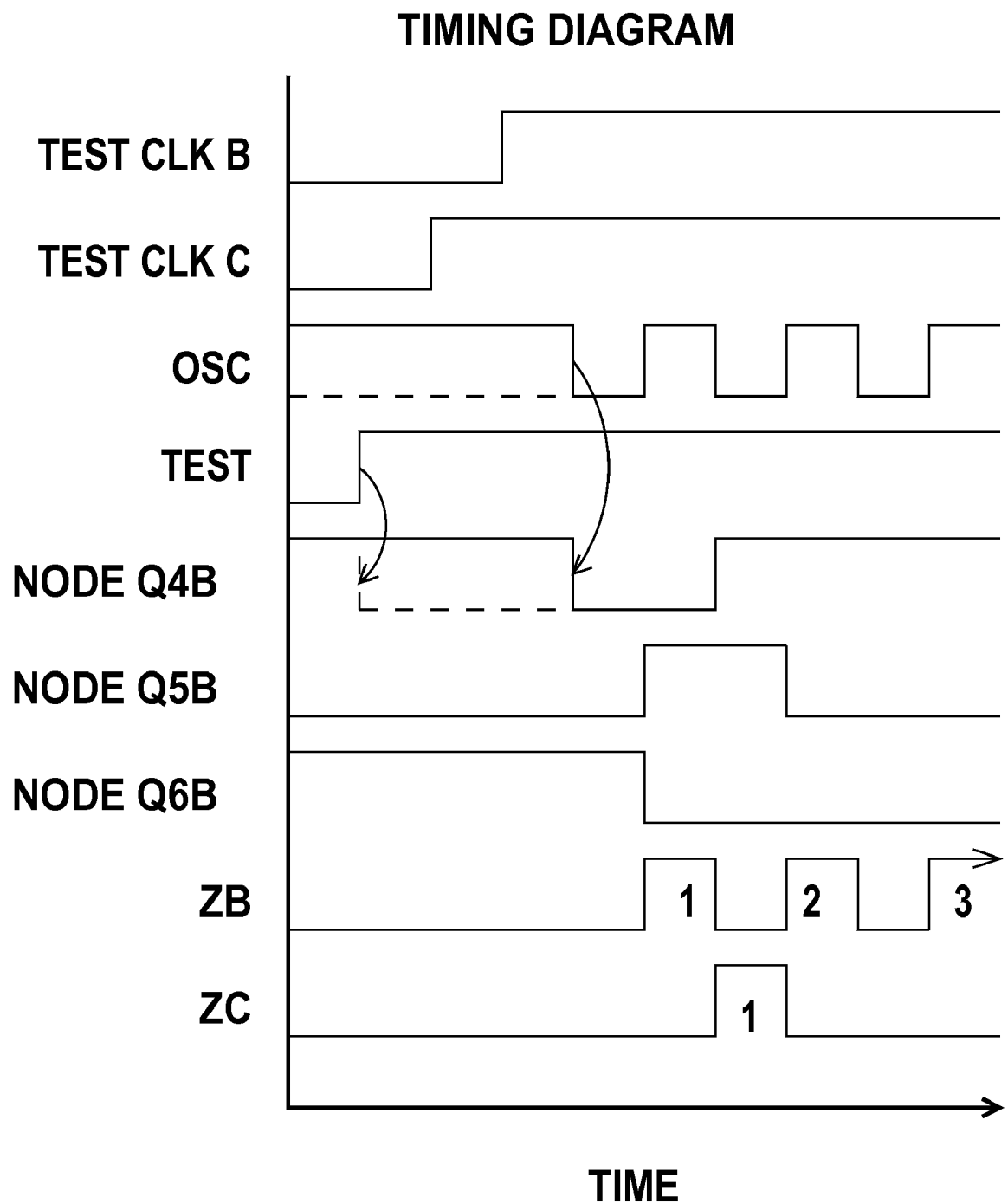
FIG. 14 is a timing diagram of the compact clock splitter of FIG. 13.
Figure 15:
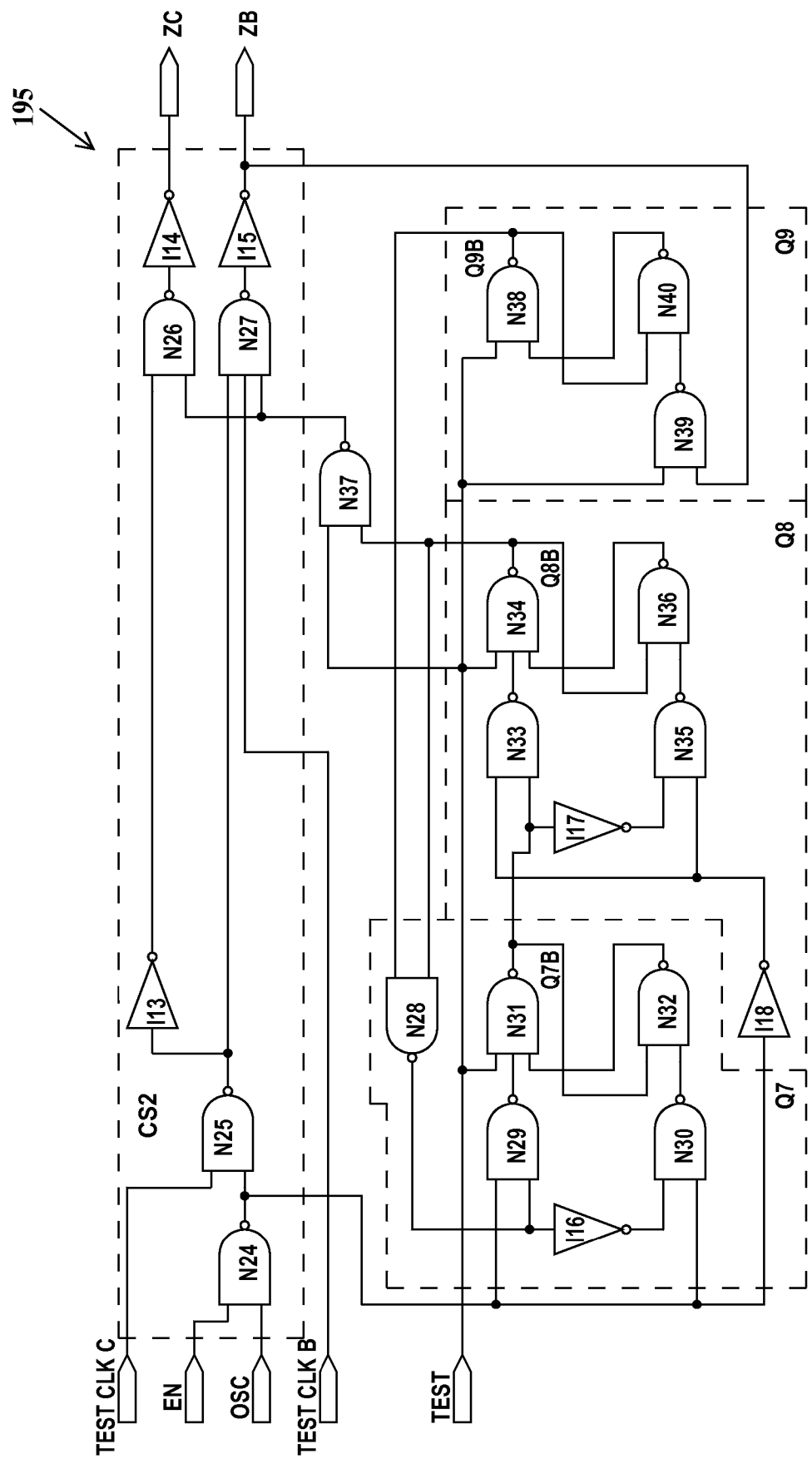
FIG. 15 is a schematic circuit diagram of a second compact clock splitter according to the present invention.

The operation of compact clock splitter 190 is best understood with reference to FIGS. 14 and 15. FIG. 14 is a timing diagram of compact clock splitter 190 of FIG. 13. Compact clock splitter 190 takes OSC and generates the non-overlapping clock pulses ZB and ZC used to control LSSD scan chains as described supra. ZB goes high when OSC goes high and allows transfer of data between L1 and L2 latches of the L1/L2 LSSD latches. ZC goes high when OSC goes low and latches data at the D pins of the L1 latch of the L1/L2 LSSD latches. The time period from the rising edge of ZB to the falling edge of ZC is the time period for data to propagate through the L2 latch of the L1/L2 LSSD latch, through the logic being tested and then be latched by the L1 latch. The ZB-ZC pulse duration is from the first rising edge of OSC to the next rising edge of OSC.

When in functional mode, TEST is low. Test low forces the output of inverter I7 high and the output of NOR gate N16 low, disabling ZC control. As NOR gate N16 output is a DC non-switching level in this mode, no delay is added. TEST low also drives the AND output of AOI5 low, removing AOI5 from the ZB control path. TEST low also drives nodes Q4B and Q6B to high states and node Q5B to a low state. The output of I7 further forces NOR gate N19 low. This stops OSC from propagating through nodes Q4B, Q5B and Q6B eliminating switching power in the functional as well as any test mode where TEST is low.

In test mode, TEST goes high, the output of inverter I7 goes low and NOR gate N16 is enabled to control ZC as a function of the state of node Q5B, and NOR gate N19 is enabled to allow OSC to propagate to latches Q4 and Q5. If OSC is high when TEST goes high, node Q4B will remain high until the falling edge of OSC to prevent ZB from going high. As node Q4B will be in a low state or go low at a falling edge of OSC, ZB is enabled one half a cycle in advance of the first rising edge of OSC and no delay results, allowing the ZB pulse to occur with the same timing as OSC in functional mode.

With the first rising edge of OSC (and node Q4B low), node Q5B goes high, returning control of ZC to OSC. As this occurs one half cycle before the falling edge of OSC, no delay results, allowing the ZC pulse to occur with the same timing as OSC in functional mode.

Also with the first rising edge of OSC (and node Q4B low), node Q6B goes low, setting up latch Q4 so node Q4b will revert high on the next falling edge of OSC, and allowing node Q5B to go low on the next rising edge of OSC. As the logic path delay through latch Q5 and NOR gate N16 to NOR gate N17 is longer than the delay from OSC through NAND gates N14 and N15 to NOR gate N17, the rising edge of OSC terminates the ZC pulse and then the falling edge of the signal at node Q5B arrives later and eliminates the possibility of any further ZC pulses and allowing the ZB pulse to occur with the same timing as OSC in functional mode.

It should be noted that the functional operation of latches Q4, Q5 and Q6 just described is essentially the same as the operation of latches Q1, Q2 and Q3 of tester controller 105 of FIG. 3 or 165 of FIG. 10 described supra, except CN1, CN2 and CNSE are operated upon, not ZB and ZC directly.

The pattern of ZB and ZC pulses produced by compact clock splitter 190 is always ZB first, ZC second, and ZB third, the rising edge of ZC always aligned with the falling edge of the first ZB pulse and the falling edge of the ZC pulse aligned with the rising edge of the second ZB pulse. Thereafter, a series of ZB pulses are produced which cause no LSSD state changes but do consume some switching power. These "unneeded" ZB pulses are eliminated in the fifth embodiment of the present invention.

FIG. 15 is a schematic circuit diagram of a second compact clock splitter according to the present invention. In FIG. 15, a compact test splitter 195 includes a first latch Q7, a second latch Q8, a third latch Q9 (latches Q7, Q8 and Q9 forming a state machine), an output stage CS2, a NAND gate N37, a C test clock pin (TEST CLK C), an enable pin (EN), an OSC pin (OSC), a B test clock pin (TEST CLK B), a mode pin (TEST) a first output pin (ZC) and a second output pin (ZB).

First latch Q7 includes NAND gates N28, N29, N30, N31 and N32 and an inverter I16. The output of NAND gate N28 is connected to a first input of NAND gate N29 and the input of inverter I16. The output of inverter I16 is connected to a first input of NAND gate N30. The output of NAND gate N30 is connected to a first input of NAND gate N31. The output of NAND gate N29 is connected to a first input of NAND gate N32. The output of NAND gate N32 is connected to a second input of NAND gate N31 and the output of NAND gate N31 (a node Q7B) is connected to a second input of NAND gate N32.

Second latch Q8 includes NAND gates N33, N34, N35 and N36 and inverters I17 and I18. The output of inverter I18 is connected to a first input of NAND gate N35 and a first input of NAND gate N33. The second input of NAND gate N33 is connected to the input of inverter I17 and the output of inverter I17 is connected to a second input of NAND gate N35. The output of NAND gate N33 is connected to a first input of NAND gate N34 and the output of NAND gate N35 is connected to a first input of NAND gate N36. The output of NAND gate N36 is connected to a second input of NAND gate N34 and the output of NAND gate N34 (a node Q8B) is connected to a second input of NAND gate N36.

Third latch Q9 includes NAND gates N38, N39 and N40. The output of NAND gate N39 is connected to a first input of NAND gate N40. The output of NAND gate N40 is connected to a first input of NAND gate N38 and the output of NAND gate N38 (a node Q9B) is connected to a second input of NAND gate N40.

Output stage CS2 includes NAND gates N24, N25, N26 and N27 and inverters I13, I14 and I15. TEST CLK C is connected to a first input of NAND gate N25. EN is connected to first input of NAND gate N24 and OSC is connected to a second input of NAND gate N24. The output of NAND gate N24 is connected to a second input of NAND gate N25. The output of NAND gate N25 is connected to a first input of NAND gate N26 through inverter I13 and to a first input of NAND gate N27. TEST CLK B is connected to a second input of NAND gate N27. The output of NAND gate N26 is connected through inverter I14 to ZC and the output of NAND gate N27 is connected through inverter I15 to ZB.

Interconnections between output stage CS2 and latch stages Q7, Q8 and Q9 are as follows: TEST is connected to a third input of NAND gate N31, a third input of NAND gate N34, a first input of NAND gate N37, a second input of NAND gate N38 and a first input of NAND gate N39. The output of NAND gate N24 is also connected to a second input of NAND gate N29, a second input of NAND gate N30 and the input of inverter I18. Node Q7B is also connected to the input of inverter I17 (and thus the second input of NAND gate N33). The output of node I15 is connected to a second input of NAND gate N39. Node Q8B is also connected to a second input of NAND gate N37 and a first input of NAND gate N28. Node Q9B is also connected to a second input of NAND gate N28. The output of NAND gate N37 is connected to a second input of NAND gate N26 and a second input of NAND gate N27.

Compact splitter 195 operates in a similar manner as compact splitter 190 of FIG. 1, except only two ZB pulses are generated. Latches Q7 and Q8 are master/slave "D" type latches. In order to reduce transistor count, each master/slave latch could be replaced with a single latch connected to a first input of an AND gate and also connected through an inverter to a second input of the same AND gate to provide a control pulse sensitive to the rising edge of the corresponding TEST CLK B or TEST CLK C. However, the ZB and ZC pulse duration is a "designed in" delay and not a delay governed by rising OSC edges.

Figure 16:
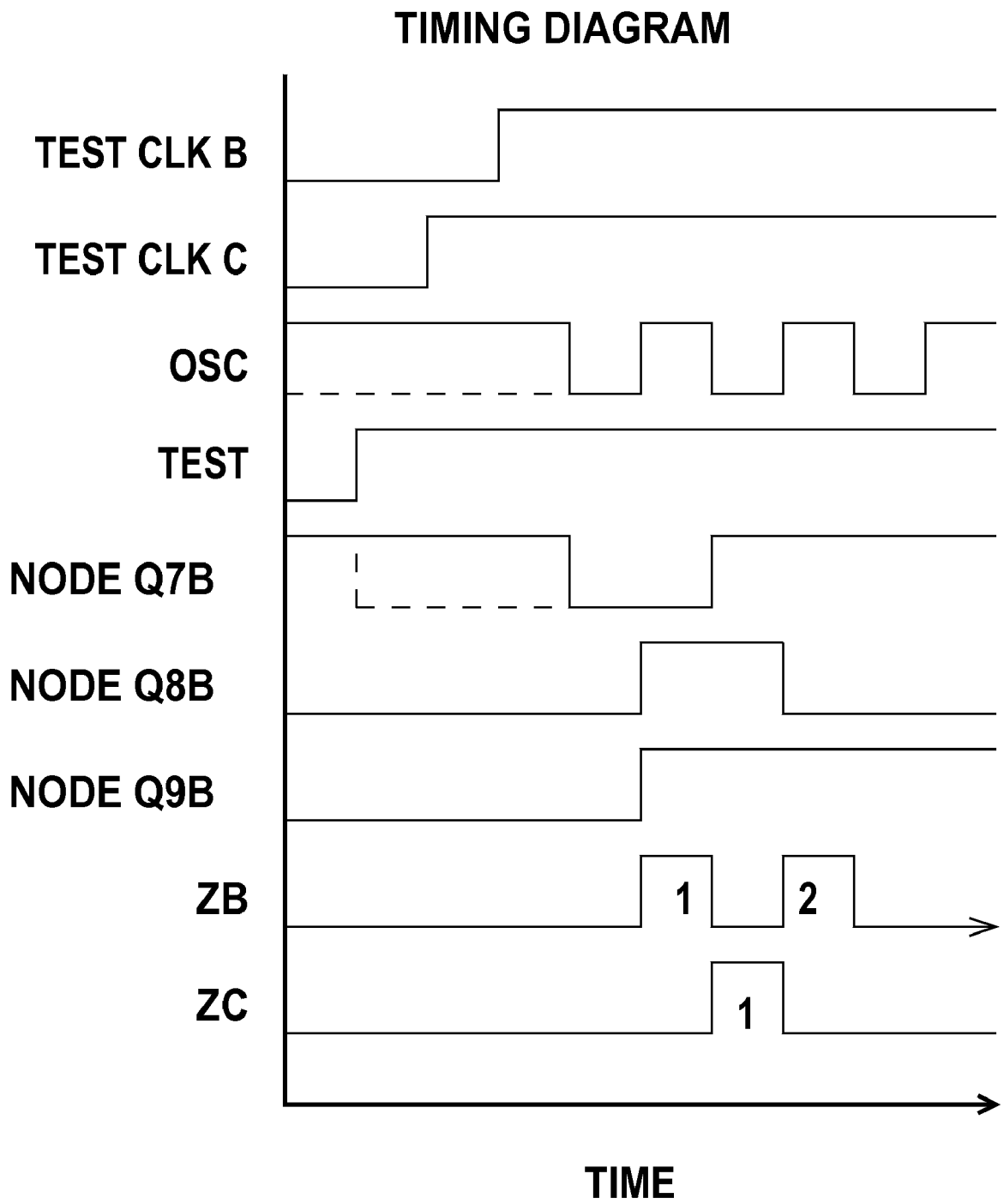
FIG. 16 is a timing diagram of the compact clock splitter of FIG. 15.

FIG. 16 is a timing diagram of compact clock splitter 195 of FIG. 15. The only difference between the timing diagram of FIG. 14 and that of FIG. 16 is there are only two ZB pulses in the timing diagram of FIG. 16.

Thus, the present invention provides a method and circuit for testing integrated circuits at functional.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, throughout the description of the present invention supra, types of latches called an L1L2 or MUX scan latches were used. The use of an L1L2 latch or MUX scan latch should be considered exemplary and other types of latches well known in the art may be substituted and adjustments to the test controller of the present invention made if and as required. Therefore, it is intended that the following claims cover all such modifications and changes as fall within the true spirit and scope of the invention.

What is claimed is:

1. An integrated circuit, comprising:
   a test pin, a select enable pin, a functional clock pin, a scan-in pin and a scan-out pin;
   a test controller having a test input connected to said test pin, a functional clock input connected to said functional clock pin, a first control output and a second control output; and
   a scan chain comprised of serially connected latches and corresponding multiplexers, a first stage of each latch having an data input, a clock input connected to said functional clock pin and a first control input connected to said first control output of said test controller, a second stage of each latch having a data output and a second control input connected to said second control output of said tester controller, each multiplexer having a first selectable input, a second selectable input and an output and having a select enable input connected to said select enable pin, the data output of a previous latch of said scan chain connected to the first selectable input of a subsequent multiplexer corresponding to an immediately subsequent latch, the output of said subsequent multiplexer connected to the data input of said immediately subsequent latch, and the first selectable input of a first multiplexer corresponding to a first latch of said scan chain connected to said scan-in pin and a data output of a last latch of said scan chain connected to said scan-out pin.

2. The circuit of claim 1, wherein said test controller comprises:
   an output of a first latch connected to an input of a second latch, an output of said second latch connected to an input of a third latch, said second latch having a feedback connection to an input of said first latch and said third latch having feedback connections to said first and said second latches;
   said first latch connected through first combinational logic to said first control output and connected through second combinational logic to said second control output;
   said feedback connection of said second latch further connected through said first combinational logic to said first control output; and
   said test pin connected to said first and second combinational logic and said functional clock pin connected through third combinational logic to said first, second and third latches.

3. The circuit of claim 1, wherein:
   said test controller is configured to generate a first control signal of one cycle of said functional clock signal in duration on said first control pin upon a transition from a first state to a second state of a test signal applied to said test pin;
   said test controller is configured to generate a second control signal on said second control output upon said transition from said first state to said second state of said test signal applied to said test pin; and
   said second control signal having a duration of two cycles of a functional clock signal applied to said functional clock pin and said first control signal starting a half a cycle of said functional clock cycle after the start of said second control signal.

4. The circuit of claim 3, wherein:
   said test controller is configured to, within a sequence of five consecutive edges of said functional clock signal, each edge defining a change of state of said functional clock signal, generate said second control signal on a first edge and to terminate said second control signal on a fifth edge if said functional clock is in a high state prior to said test signal transitioning to a high state and to generate said first control signal on a second edge and to terminate said first signal on a fourth edge of said sequence of five consecutive edges of said functional clock signal if said functional clock is in a high state prior to said test signal transitioning to a high state; and said test controller is configured, within a sequence of four consecutive edges of said functional clock signal, each edge defining a change of state of said functional clock signal, to generate said second control signal on a first edge and to terminate said second control signal on a fourth edge of said sequence of four consecutive edges of said functional clock signal if said functional clock is in a low state prior to said test signal transitioning to a high state and to generate said first control signal on a first edge and to terminate said second control signal on a third edge of said sequence of four consecutive edges of said functional clock signal if said functional clock is in a low state prior to said test signal transitioning to a high state.

5. The circuit of claim 3, wherein said scan chain is configured so said first control signal causes data on said selected outputs of said multiplexers of said scan chains to be latched by said first stages of said latches and said second control signal causes data in said first stages of said latches to be captured by said second stages of said latches.

6. The circuit of claim 3, wherein:
said scan chain is configured so when said test signal is in said second state, data previously entered into first stages of said latches while said test signal was in said first state is prevented from being replaced until after a data transfer from said first stages of said latches to second stages of said latches while said test signal is in said second state.

7. The circuit of claim 1, wherein each latch of said scan chain includes a clock gate control circuit connected between said first and second control inputs and of said latches and first and second data latch sections of said latches.

8. The circuit of claim 7, wherein said clock gate control circuit is responsive to said first and second control signals to prevent further signal propagation between said output of said clock selection circuit and said clock input pins of said latches after termination of said control signal.

9. The circuit of claim 1, wherein said test controller comprises:
a first latch having first, second, third and fourth inputs and first and second outputs;
a second latch having first, second, third and fourth inputs and first and second outputs;
a third latch having first, second and third inputs and an output;
combinational logic having a test signal input, a functional clock signal input, a first control signal output and a second control signal output;
said first output of said first latch connected to said first input of said second latch, said first output of said second latch connected to said first input of said third latch, said second output of said second latch connected to said first input of said first latch, and said output of said third latch connected to said third inputs of said first latch and second latches;
said combinational logic connected to said first, second and fourth inputs and said second output of said first latch, to said second and fourth inputs and said second output of said second latch and to said second and third inputs of said third latch; and
wherein said combinational logic connects said second output of said first latch to said second control signal output, connects said second output of said second latch to said first control signal output, connects said second input of said first latch, said second input of said second latch and said second input of said third latch to said functional clock signal input, and connects said fourth input of said first latch, said fourth input of said second latch and said third input of said third latch to said test signal input.

10. A method of testing an integrated circuit, comprising:
providing a test pin, a select enable pin, a functional clock pin, a scan-in pin and a scan-out pin;
providing a test controller having a test input connected to said test pin, a functional clock input connected to said functional clock pin, a first control output and a second control output; and
providing a scan chain comprised of serially connected latches and corresponding multiplexers, a first stage of each latch having an data input, a clock input connected to said functional clock pin and a first control input connected to said first control output of said test controller, a second stage of each latch having a data output and a second control input connected to said second control output of said tester controller, each multiplexer having a first selectable input, a second selectable input and an output and having a select enable input connected to said select enable pin, the data output of a previous latch of said scan chain connected to the first selectable input of a subsequent multiplexer corresponding to an immediately subsequent latch, the output of said subsequent multiplexer connected to the data input of said immediately subsequent latch, and the first selectable input of a first multiplexer corresponding to a first latch of said scan chain connected to said scan-in pin and a data output of a last latch of said scan chain connected to said scan-out pin.

11. The method of claim 10, wherein said test controller includes:
an output of a first latch connected to an input of a second latch, an output of said second latch connected to an input of a third latch, said second latch having a feedback connection to an input of said first latch and said third latch having feedback connections to said first and said second latches;
said first latch connected through first combinational logic to said first control output and connected through second combinational logic to said second control output;
said feedback connection of said second latch further connected through said first combinational logic to said first control output; and
said test pin connected to said first and second combinational logic and said functional clock pin connected through third combinational logic to said first, second and third latches.

12. The method of claim 10, further including:
said test controller generating a first control signal of one cycle of said functional clock signal in duration on said first control pin upon a transition from a first state to a second state of a test signal applied to said test pin;
said test controller generating a second control signal on said second control output upon said transition from said first state to said second state of said test signal applied to said test pin; and
said second control signal having a duration of two cycles of a functional clock signal applied to said functional clock pin and said first control signal starting a half a cycle of said functional clock cycle after the start of said second control signal.

13. The method of claim 12, further including:
if said functional clock is in a high state prior to said test signal transitioning to a high state then, within a sequence of five consecutive edges of said functional clock signal each edge defining a change of state of said functional clock signal, generating said second control signal on a first edge and terminating said second control signal on a fifth edge, and generating said first control signal on a second edge and terminating said first control signal on a fourth edge of said sequence of five consecutive edges of said functional clock signal; and if said functional clock is in a low state prior to said test signal transitioning to a high state, then within a sequence of four consecutive edges of said functional clock signal each edge defining a change of state of said functional clock signal, generating said second control signal on a first edge and terminating said second control signal on a fourth edge, and said generating said first control signal on a first edge and terminating said first control signal on a third edge of said sequence of four consecutive edges of said functional clock signal.

14. The method of claim 12, further including:

latching data on said selected outputs of said multiplexers of said scan chains by said first stages of said latches in response to said first control signal and capturing data in said first stages of said latches by said second stages of said latches in response to said second control signal.

15. The method of claim 12, wherein:

when said test signal is in said second state, data previously entered into first stages of said latches while said test signal was in said first state is prevented from being replaced until after a data transfer from said first stages of said latches to second stages of said latches while said test signal is in said second state.

16. The method of claim 12, further including:

connecting a clock gate control circuit between said first and second control inputs of said latches and first and second data latch sections of said latches.

17. The method of claim 16, wherein said clock gate control circuit is responsive to said first and second control signals generated on said first and second control outputs of said test controller in order to prevent signal propagation between said output of said clock selection circuit and said clock input pins of said latches after termination of said control signal.

18. The method of claim 10, wherein said test controller comprises:

a first latch having first, second, third and fourth inputs and first and second outputs;

a second latch having first, second, third and fourth inputs and first and second outputs;

a third latch having first, second and third inputs and an output;

combinational logic having a test signal input, a functional clock signal input, a first control signal output and a second control signal output;

said first output of said first latch connected to said first input of said second latch, said first output of said second latch connected to said first input of said third latch, said second output of said second latch connected to said first input of said first latch, and said output of said third latch connected to said third inputs of said first latch and second latches;

said combinational logic connected to said first, second and fourth inputs and said second output of said first latch, to said second and fourth inputs and said second output of said second latch and to said second and third inputs of said third latch; and wherein said combinational logic connects said second output of said first latch to said second control signal output, connects said second output of said second latch to said first control signal output, connects said second input of said first latch, said second input of said second latch and said second input of said third latch to said functional clock signal input, and connects said fourth input of said first latch, said fourth input of said second latch and said third input of said third latch to said test signal input.

\* \* \* \* \*